US007936602B2

(12) United States Patent
Li et al.

(10) Patent No.: US 7,936,602 B2
(45) Date of Patent: *May 3, 2011

(54) USE OF DATA LATCHES IN CACHE OPERATIONS OF NON-VOLATILE MEMORIES

(75) Inventors: Yan Li, Milpitas, CA (US); Emilio Yero, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/495,200

(22) Filed: Jun. 30, 2009

(65) Prior Publication Data

US 2009/0262578 A1    Oct. 22, 2009

Related U.S. Application Data

(63) Continuation of application No. 11/619,513, filed on Jan. 3, 2007, now Pat. No. 7,577,037, which is a continuation of application No. 11/097,590, filed on Apr. 1, 2005, now Pat. No. 7,206,230.

(51) Int. Cl.
    *G11C 11/34* (2006.01)
(52) U.S. Cl. .......... 365/185.03; 365/185.17; 365/185.22
(58) Field of Classification Search ............. 365/185.03, 365/185.17, 185.22
    See application file for complete search history.

(56) References Cited

U.S. PATENT DOCUMENTS

| 4,357,685 A | 11/1982 | Daniele et al. |
| 4,785,427 A | 11/1988 | Young |
| 5,034,922 A | 7/1991 | Burgess |
| 5,070,032 A | 12/1991 | Yuan et al. |
| 5,093,806 A | 3/1992 | Tran |
| 5,095,344 A | 3/1992 | Harari |
| 5,172,338 A | 12/1992 | Mehrotra et al. |
| 5,245,571 A | 9/1993 | Takahashi |
| 5,313,421 A | 5/1994 | Guterman et al. |
| 5,315,541 A | 5/1994 | Harari et al. |
| 5,343,063 A | 8/1994 | Yuan et al. |
| 5,388,222 A | 2/1995 | Chisvin et al. |

(Continued)

FOREIGN PATENT DOCUMENTS

EP    0 615 184 A2    9/1994

(Continued)

OTHER PUBLICATIONS

"Communication Relating to the Results of the Partial International Search" in PCT/US03/29603, EPO International Searching Authority, Jul. 30, 2004, 2 pages.

(Continued)

*Primary Examiner* — Huan Hoang
(74) *Attorney, Agent, or Firm* — Davis Wright Tremaine LLP

(57) ABSTRACT

Methods and circuitry are present for improving performance in non-volatile memory devices by allowing the inter-phase pipelining of operations with the same memory, allowing, for example, a read operation to be interleaved between the pulse and verify phases of a write operation. In the exemplary embodiment, the two operations share data latches. In specific examples, at the data latches needed for verification in a multi-level write operation free up, they can be used to store data read from another location during a read performed between steps in the multi-level write. In the exemplary embodiment, the multi-level write need only pause, execute the read, and resume the write at the point where it paused.

12 Claims, 18 Drawing Sheets

U.S. PATENT DOCUMENTS

| | | | |
|---|---|---|---|
| 5,418,752 | A | 5/1995 | Harari et al. |
| 5,422,856 | A | 6/1995 | Sasaki et al. |
| 5,509,134 | A | 4/1996 | Fandrich et al. |
| 5,519,847 | A | 5/1996 | Fandrich et al. |
| 5,532,962 | A | 7/1996 | Auclair et al. |
| 5,537,356 | A | 7/1996 | Akaogi et al. |
| 5,570,315 | A | 10/1996 | Tanaka et al. |
| 5,595,924 | A | 1/1997 | Yuan et al. |
| 5,661,053 | A | 8/1997 | Yuan |
| 5,691,994 | A | 11/1997 | Acosta et al. |
| 5,692,165 | A | 11/1997 | Jeddeloh et al. |
| 5,768,192 | A | 6/1998 | Eitan |
| 5,768,215 | A | 6/1998 | Kwon et al. |
| 5,774,397 | A | 6/1998 | Endoh et al. |
| 5,784,705 | A | 7/1998 | Leung |
| 5,815,444 | A | 9/1998 | Ohta |
| 5,860,082 | A | 1/1999 | Smith et al. |
| 5,862,099 | A | 1/1999 | Gannage et al. |
| 5,867,429 | A | 2/1999 | Chen et al. |
| 5,872,739 | A | 2/1999 | Womack |
| 5,893,135 | A | 4/1999 | Hasbun et al. |
| 5,903,495 | A | 5/1999 | Takeuchi et al. |
| 5,912,906 | A | 6/1999 | Wu et al. |
| 5,920,502 | A | 7/1999 | Noda et al. |
| 5,949,720 | A | 9/1999 | Brady |
| 5,969,986 | A | 10/1999 | Wong et al. |
| 6,011,287 | A | 1/2000 | Itoh et al. |
| 6,011,725 | A | 1/2000 | Eitan |
| 6,029,233 | A | 2/2000 | Abily et al. |
| 6,038,174 | A | 3/2000 | Khan et al. |
| 6,046,935 | A | 4/2000 | Takeuchi et al. |
| 6,046,940 | A | 4/2000 | Takeuchi et al. |
| 6,097,638 | A | 8/2000 | Himeno et al. |
| 6,128,229 | A | 10/2000 | Nobukata |
| 6,222,762 | B1 | 4/2001 | Guterman et al. |
| 6,252,803 | B1 | 6/2001 | Fastow et al. |
| 6,253,250 | B1 | 6/2001 | Evans et al. |
| 6,266,273 | B1 | 7/2001 | Conley et al. |
| 6,324,121 | B2 | 11/2001 | Banks |
| 6,349,056 | B1 | 2/2002 | Conley et al. |
| 6,356,485 | B1 | 3/2002 | Proebsting |
| 6,373,746 | B1 | 4/2002 | Takeuchi et al. |
| 6,407,953 | B1 | 6/2002 | Cleeves |
| 6,438,038 | B2 | 8/2002 | Ikebashi et al. |
| 6,456,528 | B1 | 9/2002 | Chen |
| 6,490,199 | B2 | 12/2002 | Lee et al. |
| 6,496,415 | B2 | 12/2002 | Tsao |
| 6,504,757 | B1 | 1/2003 | Hollmer et al. |
| 6,519,180 | B2 | 2/2003 | Tran et al. |
| 6,560,143 | B2 | 5/2003 | Conley et al. |
| 6,567,302 | B2 | 5/2003 | Lakhani |
| 6,650,570 | B2 | 11/2003 | Tanzawa et al. |
| 6,657,891 | B1 | 12/2003 | Shibata et al. |
| 6,684,289 | B1 | 1/2004 | Gonzalez et al. |
| 6,687,158 | B2 | 2/2004 | Yano |
| 6,700,820 | B2 | 3/2004 | Elmhurst et al. |
| 6,717,857 | B2 | 4/2004 | Byeon et al. |
| 6,731,539 | B1 | 5/2004 | Wong |
| 6,738,289 | B2 | 5/2004 | Gongwer et al. |
| 6,744,667 | B2 | 6/2004 | Yamamoto et al. |
| 6,829,167 | B2 | 12/2004 | Tu et al. |
| 6,829,172 | B2 | 12/2004 | Bloom et al. |
| 6,829,567 | B2 | 12/2004 | Michiwaki et al. |
| 6,847,553 | B2 | 1/2005 | Chen |
| 6,856,568 | B1 | 2/2005 | Wong |
| 6,859,394 | B2 | 2/2005 | Matsunaga et al. |
| 6,925,004 | B2 | 8/2005 | Shibata et al. |
| 6,937,510 | B2 * | 8/2005 | Hosono et al. ............ 365/185.03 |
| 6,940,753 | B2 | 9/2005 | Cernea |
| 6,972,993 | B2 | 12/2005 | Conley et al. |
| 6,983,428 | B2 | 1/2006 | Cernea |
| 6,987,693 | B2 | 1/2006 | Cerenea et al. |
| 6,992,936 | B2 | 1/2006 | Tsujikawa et al. |
| 6,999,344 | B2 | 2/2006 | Hosono et al. |
| 7,009,878 | B2 | 3/2006 | Hosono et al. |
| 7,012,835 | B2 | 3/2006 | Gonzalez et al. |
| 7,023,736 | B2 | 4/2006 | Cernea et al. |
| 7,038,946 | B2 | 5/2006 | Hosono et al. |
| 7,046,568 | B2 | 5/2006 | Cernea |
| 7,050,343 | B2 * | 5/2006 | Kumar et al. ............ 365/201 |
| 7,073,103 | B2 | 7/2006 | Gongwer et al. |
| 7,120,051 | B2 | 10/2006 | Gorobets et al. |
| 7,158,421 | B2 | 1/2007 | Li et al. |
| 7,170,782 | B2 | 1/2007 | Conley et al. |
| 7,177,197 | B2 | 2/2007 | Cernea |
| 7,187,585 | B2 | 3/2007 | Li et al. |
| 7,196,931 | B2 | 3/2007 | Cernea et al. |
| 7,206,230 | B2 | 4/2007 | Li et al. |
| 7,224,614 | B1 | 5/2007 | Chan |
| 7,245,528 | B2 | 7/2007 | Shibata et al. |
| 7,251,160 | B2 | 7/2007 | Li et al. |
| 7,301,805 | B2 | 11/2007 | Gorobets et al. |
| 7,301,808 | B2 | 11/2007 | Li et al. |
| 7,301,816 | B2 | 11/2007 | Li et al. |
| 7,301,839 | B2 | 11/2007 | Li et al. |
| 7,321,510 | B2 | 1/2008 | Li et al. |
| 7,376,011 | B2 | 5/2008 | Conley et al. |
| 7,447,078 | B2 | 11/2008 | Li |
| 7,463,521 | B2 | 12/2008 | Li |
| 7,480,181 | B2 | 1/2009 | Li |
| 2001/0006477 | A1 | 7/2001 | Banks |
| 2001/0006479 | A1 | 7/2001 | Ikehashi et al. |
| 2001/0040826 | A1 | 11/2001 | Lakhani |
| 2002/0036925 | A1 | 3/2002 | Tanzawa et al. |
| 2002/0039322 | A1 | 4/2002 | Tran et al. |
| 2002/0099904 | A1 | 7/2002 | Conley et al. |
| 2002/0118574 | A1 | 8/2002 | Gongwer et al. |
| 2002/0126528 | A1 | 9/2002 | Conley et al. |
| 2002/0126531 | A1 | 9/2002 | Hosono et al. |
| 2002/0126532 | A1 | 9/2002 | Matsunaga et al. |
| 2003/0072192 | A1 | 4/2003 | Bloom et al. |
| 2003/0117850 | A1 | 6/2003 | Yano |
| 2003/0123295 | A1 | 7/2003 | Elmhurst et al. |
| 2003/0137888 | A1 | 7/2003 | Chen et al. |
| 2003/0156455 | A1 | 8/2003 | Nakamura et al. |
| 2003/0174555 | A1 | 9/2003 | Conley et al. |
| 2004/0057285 | A1 | 3/2004 | Cernea et al. |
| 2004/0057287 | A1 | 3/2004 | Cernea et al. |
| 2004/0057318 | A1 | 3/2004 | Cernea et al. |
| 2004/0060031 | A1 | 3/2004 | Cernea |
| 2004/0109357 | A1 | 6/2004 | Cernea et al. |
| 2004/0109362 | A1 | 6/2004 | Gongwer et al. |
| 2004/0160829 | A1 | 8/2004 | Tsujikawa et al. |
| 2004/0210729 | A1 | 10/2004 | Horii et al. |
| 2004/0237000 | A1 | 11/2004 | Keays |
| 2004/0240269 | A1 | 12/2004 | Cernea |
| 2005/0047217 | A1 | 3/2005 | Shibata et al. |
| 2005/0157560 | A1 | 7/2005 | Hosono et al. |
| 2005/0162913 | A1 | 7/2005 | Chen |
| 2005/0169057 | A1 | 8/2005 | Shibata et al. |
| 2005/0169082 | A1 | 8/2005 | Cernea |
| 2005/0210184 | A1 | 9/2005 | Chen et al. |
| 2005/0257120 | A1 | 11/2005 | Gorobets et al. |
| 2006/0031593 | A1 | 2/2006 | Sinclair |
| 2006/0050562 | A1 | 3/2006 | Cernea et al. |
| 2006/0126390 | A1 | 6/2006 | Gorobets et al. |
| 2006/0126394 | A1 | 6/2006 | Li |
| 2006/0136687 | A1 | 6/2006 | Smith et al. |
| 2006/0140007 | A1 | 6/2006 | Cernea et al. |
| 2006/0221692 | A1 | 10/2006 | Chen |
| 2006/0221696 | A1 | 10/2006 | Li |
| 2006/0221697 | A1 | 10/2006 | Li |
| 2006/0221704 | A1 | 10/2006 | Li |
| 2006/0221714 | A1 | 10/2006 | Li et al. |
| 2006/0233010 | A1 | 10/2006 | Li |
| 2006/0233021 | A1 | 10/2006 | Li et al. |
| 2006/0233022 | A1 | 10/2006 | Li |
| 2006/0233023 | A1 | 10/2006 | Li et al. |
| 2006/0233026 | A1 | 10/2006 | Li |
| 2006/0239080 | A1 | 10/2006 | Li |
| 2007/0002626 | A1 | 1/2007 | Li |
| 2007/0103982 | A1 | 5/2007 | Li et al. |
| 2007/0109846 | A1 | 5/2007 | Li et al. |
| 2007/0109867 | A1 | 5/2007 | Li et al. |
| 2009/0067253 | A1 | 3/2009 | Li |

FOREIGN PATENT DOCUMENTS

| | | |
|---|---|---|
| EP | 1134746 A2 | 9/2001 |
| EP | 1164595 A | 12/2001 |
| EP | 1209568 A | 5/2002 |
| EP | 1280161 A1 | 1/2003 |
| EP | 1473737 A | 11/2004 |
| JP | 5282883 | 3/1992 |
| JP | 11003290 | 1/1999 |
| JP | 2001-325796 A | 11/2001 |
| JP | 2004-206833 A | 7/2004 |
| JP | 2004-326866 A | 11/2004 |
| WO | WO 98/44420 | 10/1998 |
| WO | WO 98/44420 A1 | 10/1998 |
| WO | WO 00/49488 | 8/2000 |
| WO | WO 00/67137 | 11/2000 |
| WO | WO 02/49039 | 6/2002 |
| WO | WO 02/058074 | 7/2002 |
| WO | WO 02/069340 | 9/2002 |
| WO | WO 03/029951 | 4/2003 |
| WO | WO 03/069627 | 8/2003 |
| WO | WO 2006/107633 | 10/2006 |
| WO | WO 2006/107654 | 10/2006 |
| WO | WO 2007/130976 | 11/2007 |
| WO | WO 2007/131059 | 11/2007 |
| WO | WO 2007/131062 | 11/2007 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

EPO/ISA, "Notification of Transmittal of the International Search Report or the Declaration", mailed in PCT/US03/29603 Nov. 5, 2004, 7 pages.

EPO/ISA, "Notification of Transmittal of the International Search Report and the Written Opinion of the International Searching Authority, or the Declaration," mailed in the International Application No. PCT/US2006/011032 on Jul. 20, 2006, 9 pages.

European Patent Office (International Searching Authority), "Notification of Transmittal of the International Search Report or the Declaration", issued in corresponding PCT Application No. PCT/US03/29045, Jul. 28, 2004, 6 pages.

Imamiya et al., "A 125-mm² 1-Gb NAND Flash Memory with 10/Mbyte/s Program Speed," IEEE Journal of Solid State Circuits, vol. 37, No. 11, Nov. 2002, pp. 1493-1501.

International Search Report corresponding to PCT/US03/30133, International Searching Authority, European Patent Office, filed Sep. 18, 2003, 4 pages.

ISA/European Patent Office, "Notification of Transmittal of the International Search Report and the Written Opinion of the International Searching Authority, or the Declaration", mailed in related PCT/US2004/029426 on Jan. 20, 2005, 12 pages.

Lee et al., "High-Performance 1-Gb NAND Flash Memory with 0.12-μm Technology," Journal of Solid-State Circuits, Nov. 2002, vol. 37, No. 11, pp. 1502-1509.

Nakamura et al., "A Novel Sense Amplifier for Flexible Voltage Operation NAND Flash Memories," 1995 Symposium on VLSI Circuits Digest of Technical Papers, Jun. 8-10, 1995, pp. 71-72.

Notification of Transmittal of the International Search Report and the Written Opinion of the International Searching Authority, or the Declaration for International Application No. PCT/US2005/016341 mailed Oct. 19, 2005, 12 pages.

Notification of Transmittal of the International Search Report and the Written Opinion of the International Searching Authority, or the Declaration for International Application. No. PCT.US2006/011248 for SanDisk Corporation, mailed Jul. 24, 2006, 11 pages.

Office Action for European Patent Application No. 06739812.3 received May 5, 2008, 22 pages.

Srisa-an et al., "Performance Enhancements to the Active Memory System," 2002 IEEE International Conference on Computer Design: VLSI in Computers and Processors, Sep. 16-18, 2002, pp. 249-256.

First Office Action, Application No. 200680015583.9 dated Jul. 22, 2009, 11 pages.

EPO, "Office Action," corresponding European Patent Application No. 06 739 812.3, mailed on Mar. 17, 2008, 4 pages.

China State Intellectual Property Office, "Office Action," corresponding Chinese Patent Application No. 200680015583.9, mailed on Jul. 22, 2009, 11 pages (including translation.).

* cited by examiner

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
| | 0 | D | D | D | 1 | 1 |
| Invert | D | D | 0 | D | 0 | 1 |
| | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

USE OF DATA LATCHES IN CACHE OPERATIONS OF NON-VOLATILE MEMORIES

CROSS REFERENCE TO RELATED APPLICATIONS

This application is a continuation of application Ser. No. 11/619,513, filed on Jan. 3, 2007, now U.S. Pat. No. 7,577,037, which is a continuation of application Ser. No. 11/097,590, filed on Apr. 1, 2005, now U.S. Pat. No. 7,206,230, which applications are incorporated herein in their entirety by this reference.

This application is related to the following U.S. patent applications: application Ser. No. 11/013,125, filed Dec. 14, 2004, now U.S. Pat. No. 7,120,051; application Ser. No. 11/026,536, filed Dec. 29, 2004, now published as US PG Pub 2006/0140007; application Ser. No. 11/015,199, filed Dec. 16, 2004, now U.S. Pat. No. 7,046,568; filed Mar. 16, 2005; and application Ser. No. 11/097,517, filed Apr. 1, 2005. These applications are incorporated herein by reference in their entirety for all purposes.

FIELD OF THE INVENTION

This invention relates generally to non-volatile semiconductor memory such as electrically erasable programmable read-only memory (EEPROM) and flash EEPROM, and specifically to cache operations based on shared latch structures allowing overlapping memory operations.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set of bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

United States Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

According to one aspect of the invention, cache operations are presented that allow data to be transferred in or out of a memory while the internal memory is engaged in another operation, such as a read, program or erase. In particular, arrangements of data latches and methods of their use are described which allow such cache operations.

Architectures are described where data latches are shared by a number of physical pages. For example, read/write stacks are associated with the bit lines of the memory, which shared by multiple word lines. While one operation is going on in the memory, if any of these latch are free, they can cache data for future operations in the same or another word line, saving transfer time as this can be hidden behind another operation. This can improve performance by increasing the amount of pipelining of different operations or phases of operations. In one example, in a cache program operation, while programming one page of data another page of data can be loaded in, saving on transfer time. For another example, in one exemplary embodiment, a read operation on one word line is inserted into a write operation on another word line, allowing the data from the read to be transferred out of the memory while the data write continues on.

According to the various aspects, data from another page in the same block, but on a different word line, can be toggled out (to, for example, do an ECC operation) while a write or other operation is going on for the first page of data. This inter-phase pipelining of operations allows the time needed for the data transfer to be hidden behind the operation on the first page of data. More generally, this allows a portion of one operation to be inserted between phases of another, typically longer, operation. Another example would be to insert a sensing operation between phases of, say, an erase operation, such as before an erase pulse or before a soft programming phase used as the later part of the erase.

If a relatively long operation with different phases is being performed, a primary aspect will interpose in a quicker operation using the shared latches of the read/write stacks if latches available. For example, a read can be inserted into a program or erase operation, or a binary program can be inserted into an erase. The primary exemplary embodiments will toggle data in and/or out for one page during a program operation for another page that shares the same read write stacks, where, for example, a read of the data to be toggled out and modified is inserted into the verify phase of the data write.

The availability of open data latches can arise in a number of ways. Generally, for a memory storing n bits per cell, n such data latches will be needed for each bit line; however, not all of these latches are needed at all times. For example, in a two-bit per cell memory storing data in an upper page/lower page format, one data latch will be needed while programming the lower page (with another latch used if quick pass write is implemented). Two data latches will be needed while programming the upper page (with a third latch used if quick pass write is implemented)). More generally, for memories storing multiple pages, all of the latches will be needed only when programming the highest page. This leaves the other latches available for cache operations. Further, even while writing the highest page, as the various states are removed from the verify phase of the write operation, latches will free up. Specifically, once only the highest state remains to be verified, only a single latch is needed for verification purposes and the others may be used for cache operations.

An exemplary embodiment is based on a four state memory storing two-bits per cell and having two latches for data on each bit line and one additional latch for quick pass write, The operations of writing the lower page, or erasing, or doing a post erase soft program are basically a binary operation and have one of the data latches free, which can use it to cache data. Similarly, where doing an upper page or full sequence write, once all but the highest level has verified, only a single state needs to verify and the memory can free up a latch that can be used to cache data. An example of how this can be used is that when programming one page, such as in a copy operation, a read of another page that shares the same set of data latches, such as another word line on the same set of bit lines, can be slipped in between program pulse and verifies of the write. The address can then be switched to the page being written, allowing the write process to pick up where it left off without having to restart. While the write continues, the data cached during the interpolated read can be toggled out, checked or modified and transferred back to be present for writing back in once the earlier write operation completes. This sort cache operation allows the toggling out and modification of the second page of data to be hidden behind the programming of the first page.

Additional features and advantages of the present invention will be understood from the following description of its preferred embodiments, which description should be taken in conjunction with the accompanying drawings.

BRIEF DESCRIPTION OF THE DRAWINGS

FIG. 13 is a simplified version of FIG. 10 that shows some specific elements that are relevant to the present discussion in a two-bit embodiment of the present invention FIG. 14 indicates the latch assignment for the same elements as FIG. 13 for upper page program where the lower page data is read in.

DETAILED DESCRIPTION OF THE PREFERRED EMBODIMENTS

Figure 1A:
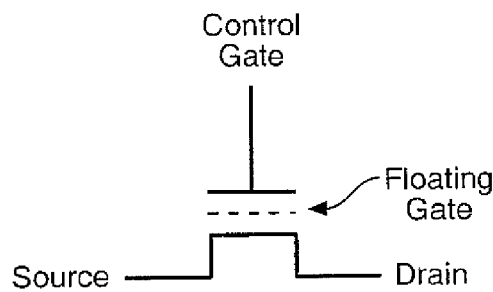
FIGS. 1A-1E illustrate schematically different examples of non-volatile memory cells.
Figure 1B:
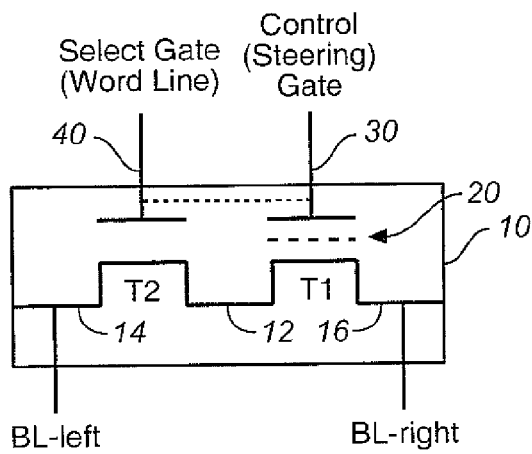
Figure 1C:
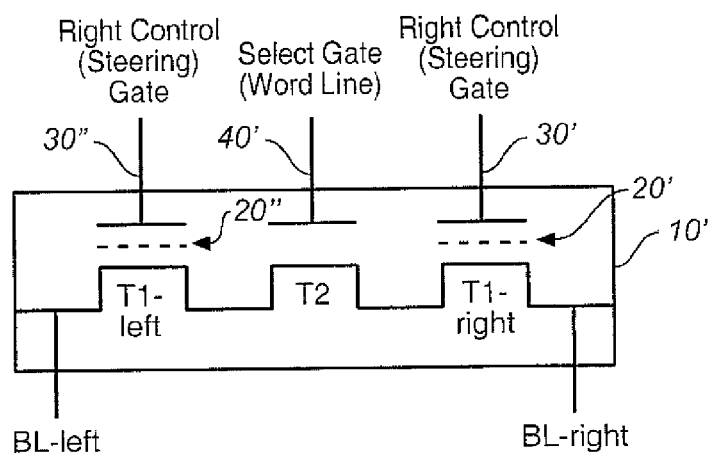
Figure 1D:
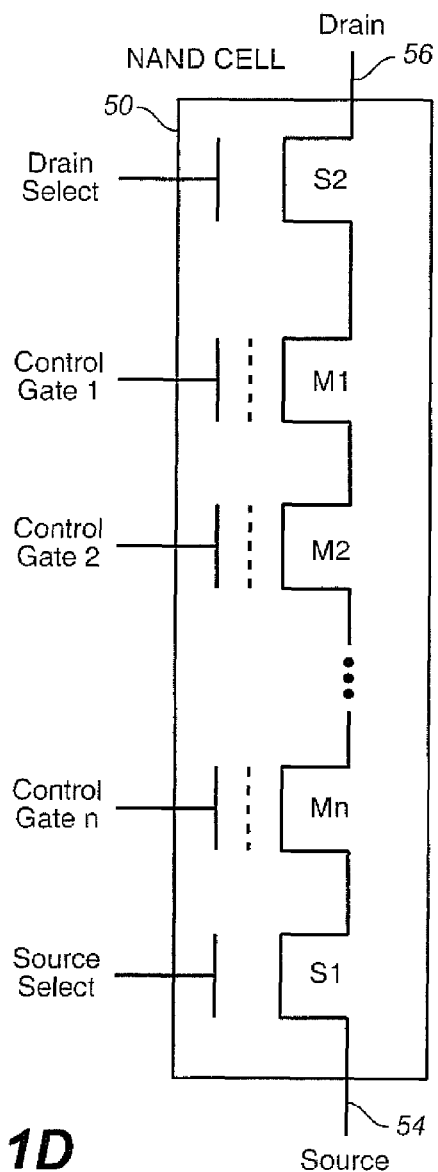
Figure 1E:
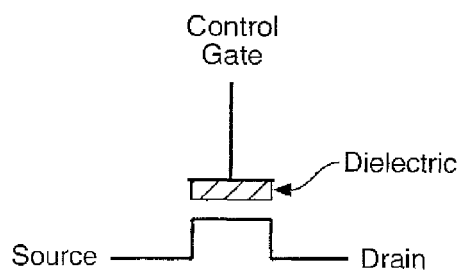
Figure 2:
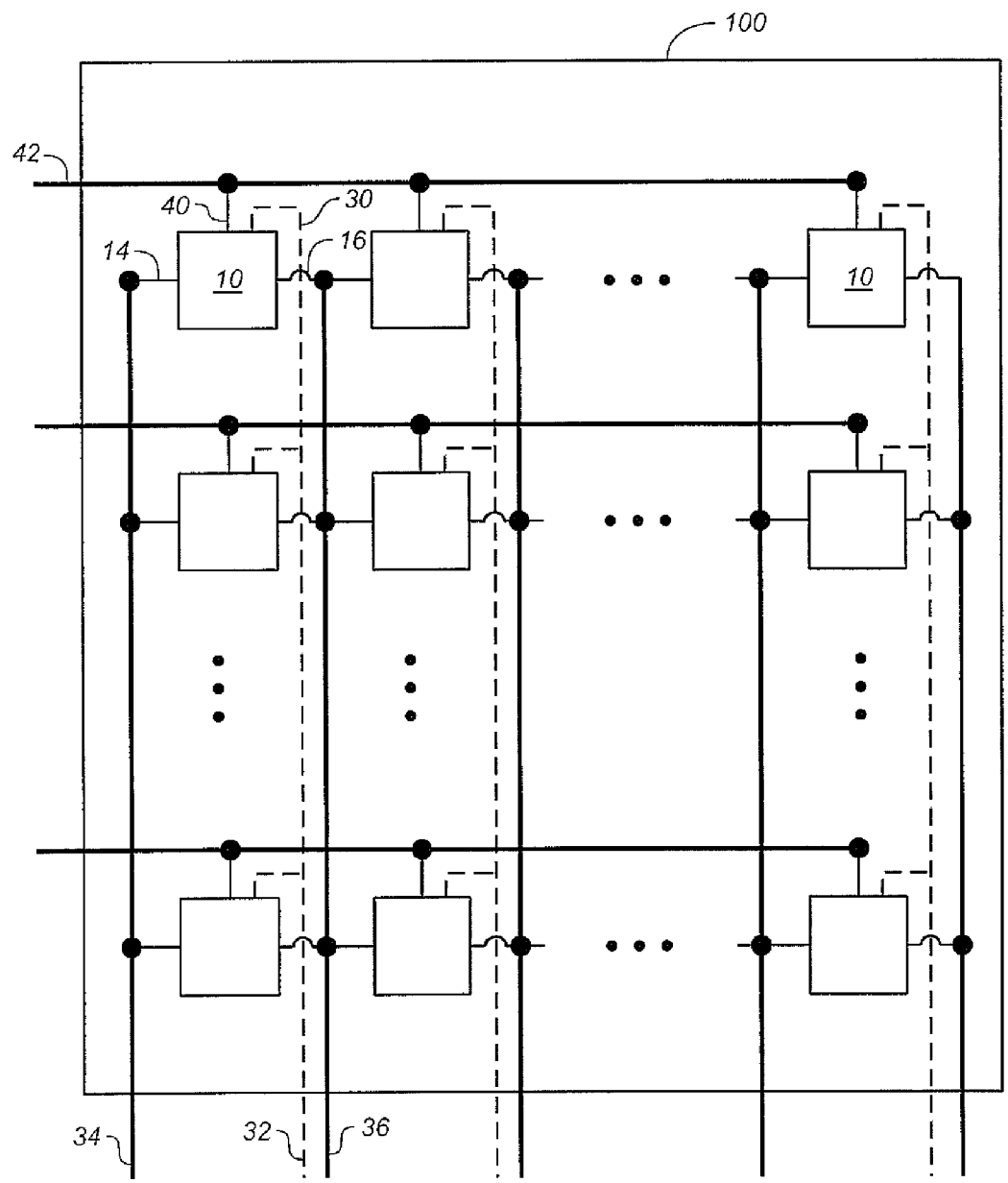
FIG. 2 illustrates an example of an NOR array of memory cells.
Figure 3:
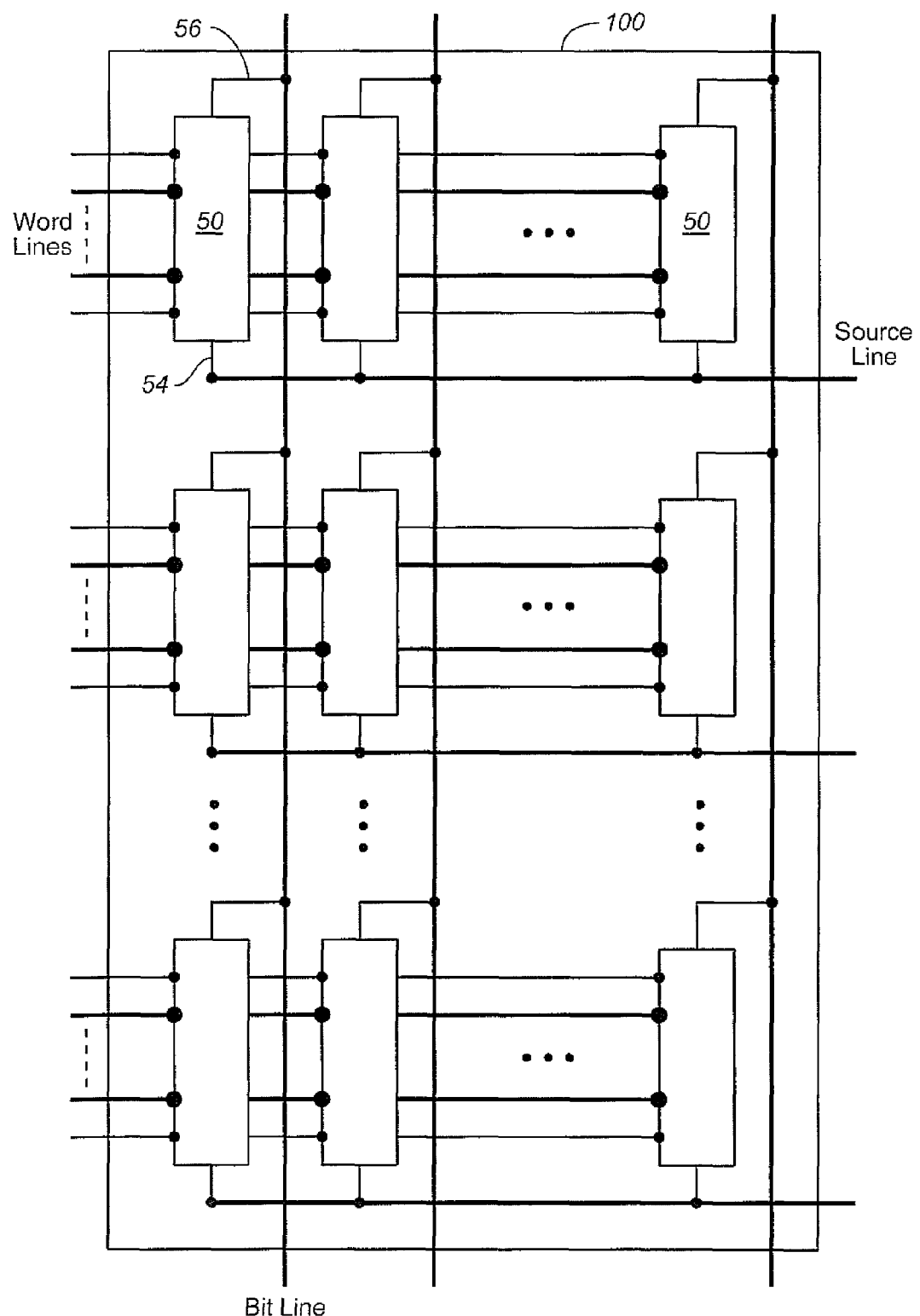
FIG. 3 illustrates an example of an NAND array of memory cells, such as that shown in FIG. 1D.
Figure 4:
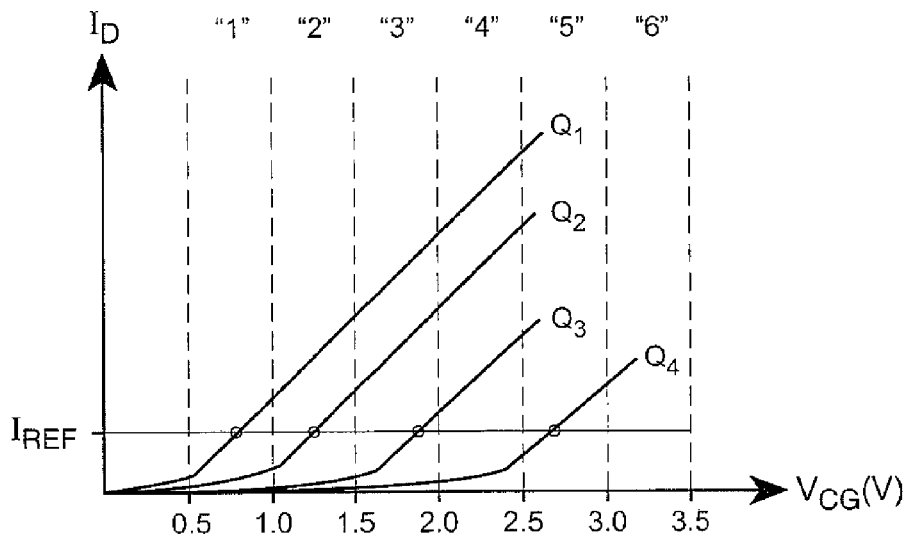
FIG. 4 illustrates the relation between the source-drain current and the control gate voltage for four different charges Q1-Q4 that the floating gate may be storing at any one time.
Figure 5:
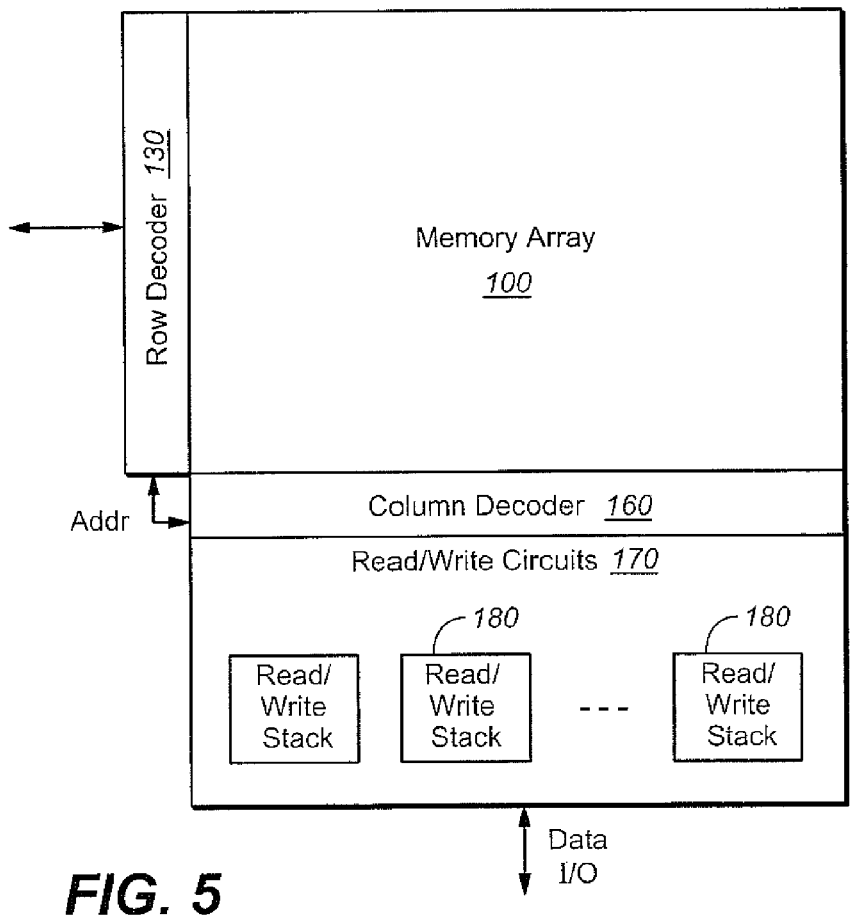
FIG. 5 illustrates schematically a typical arrangement of a memory array accessible by read/write circuits via row and column decoders.
Figure 6A:
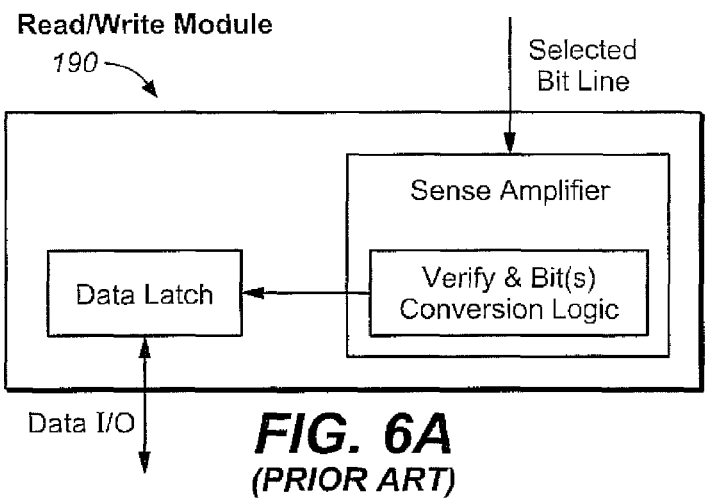
FIG. 6A is a schematic block diagram of an individual read/write module.
Figure 6B:
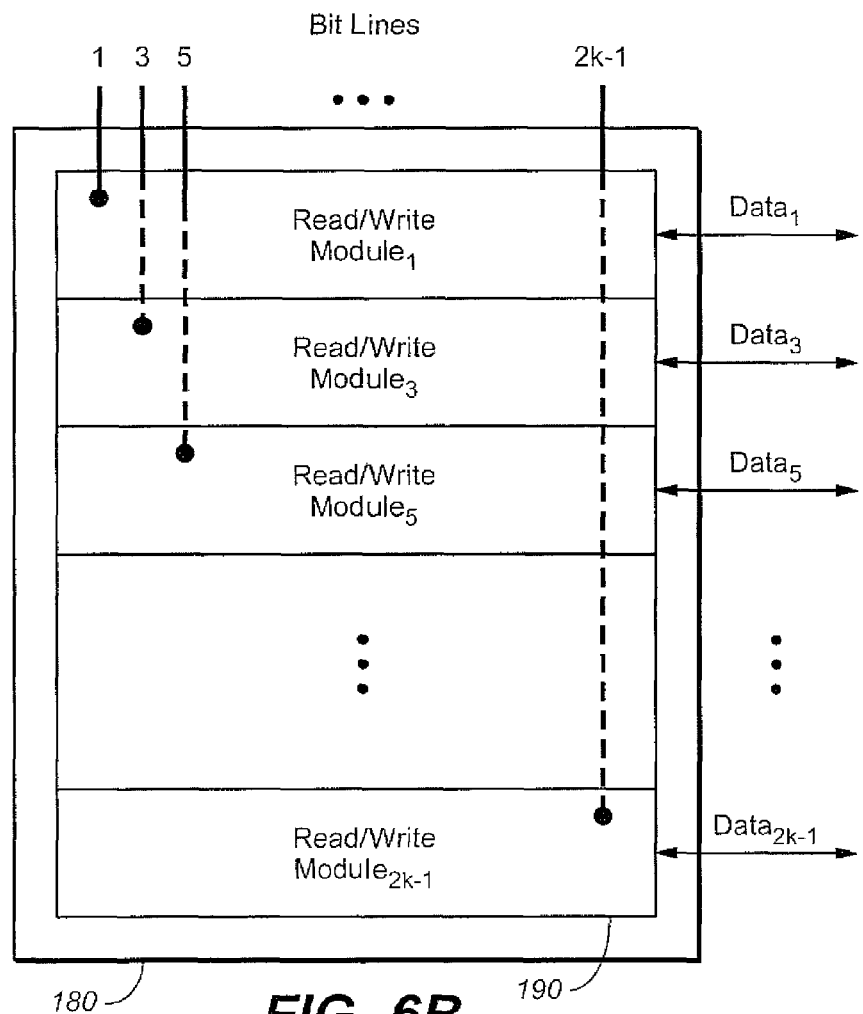
FIG. 6B shows the read/write stack of FIG. 5 implemented conventionally by a stack of read/write modules.
Figure 7A:
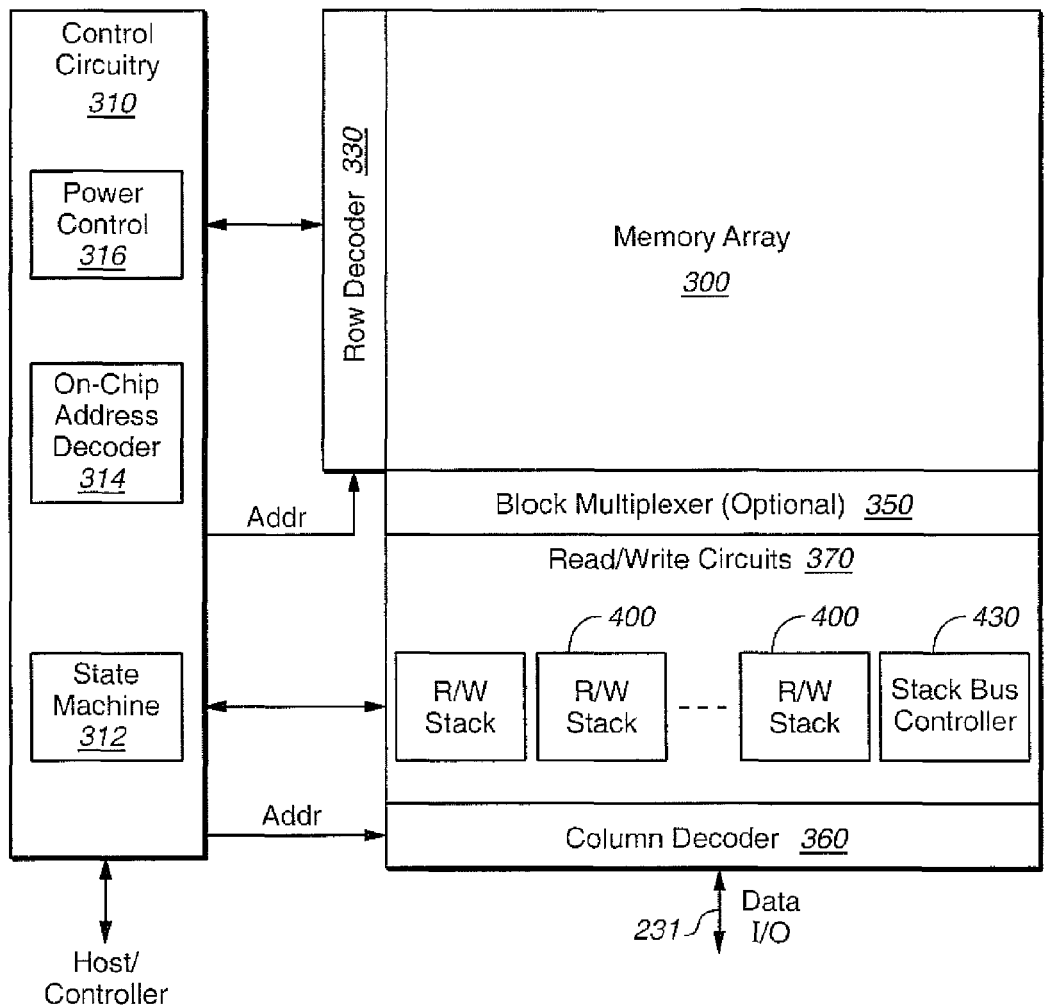
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
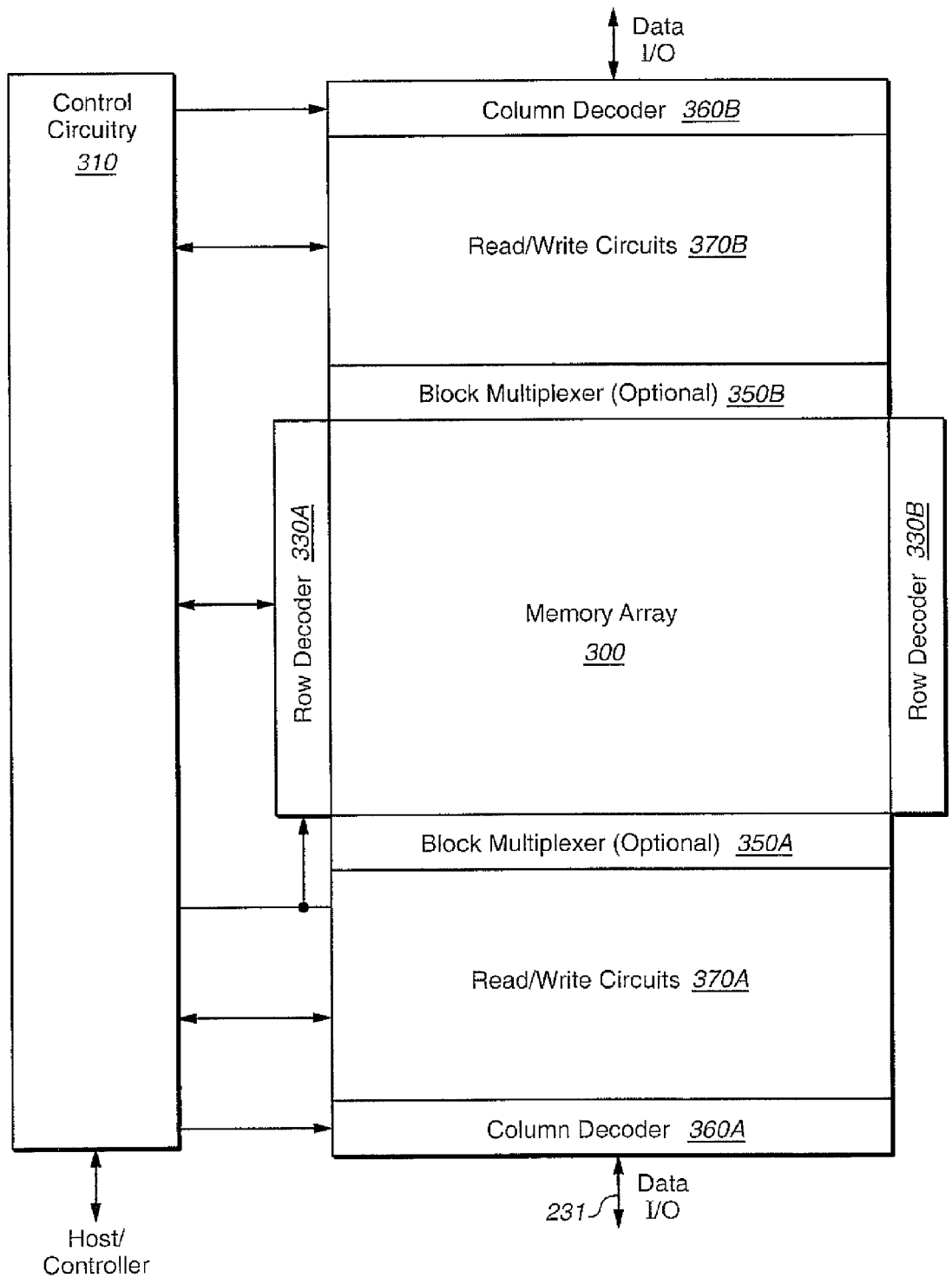
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
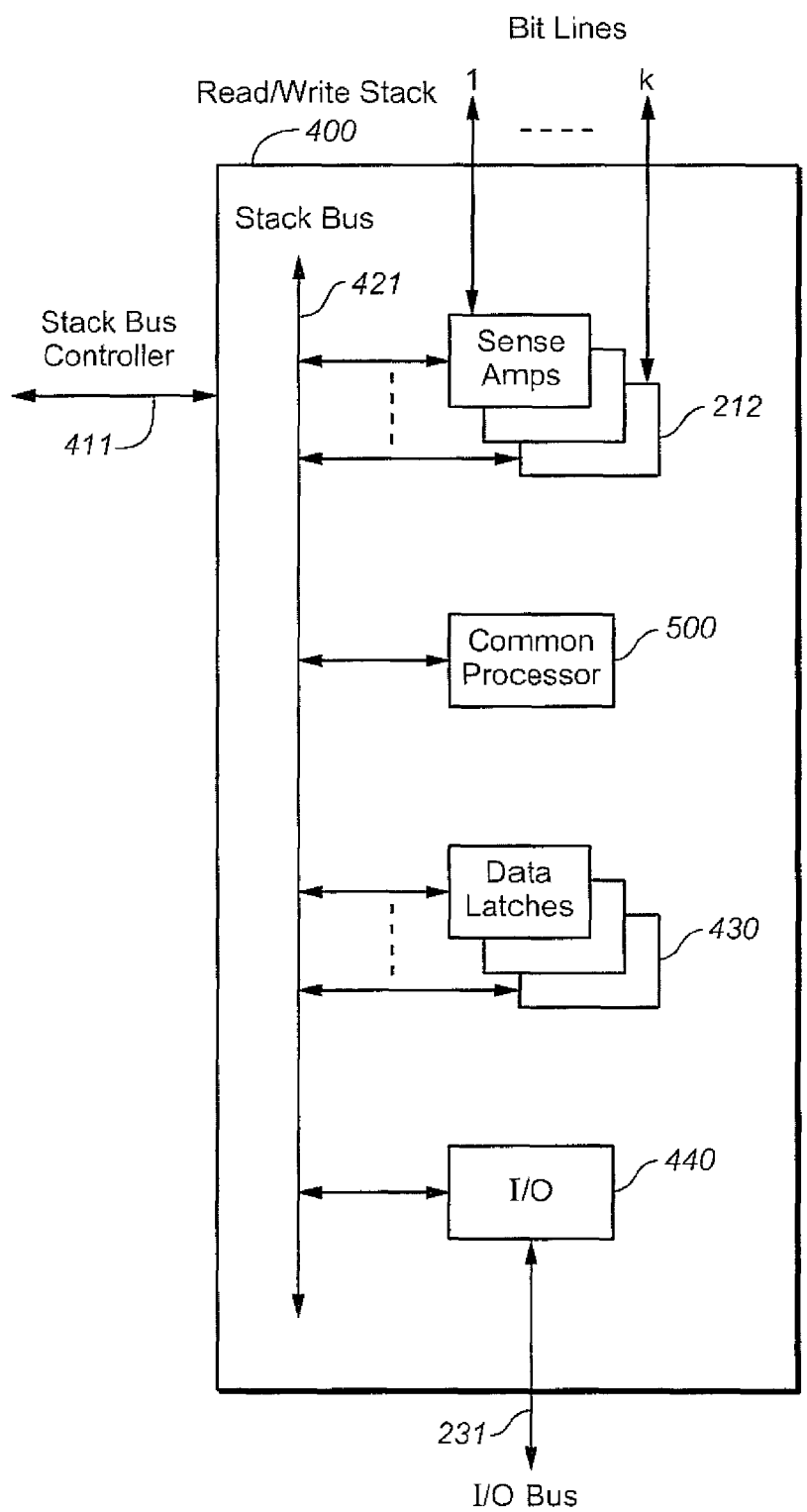
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
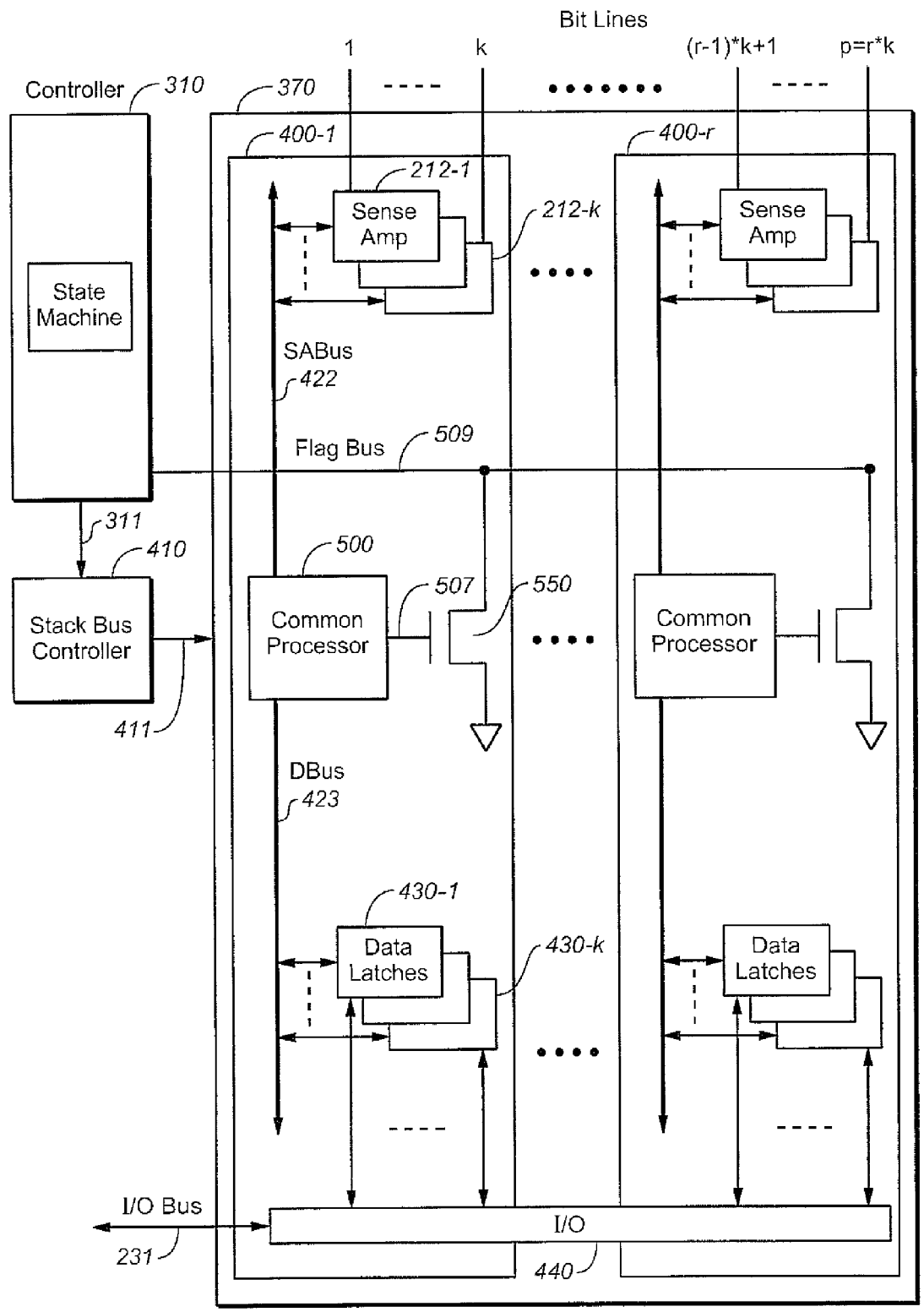
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, ..., 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
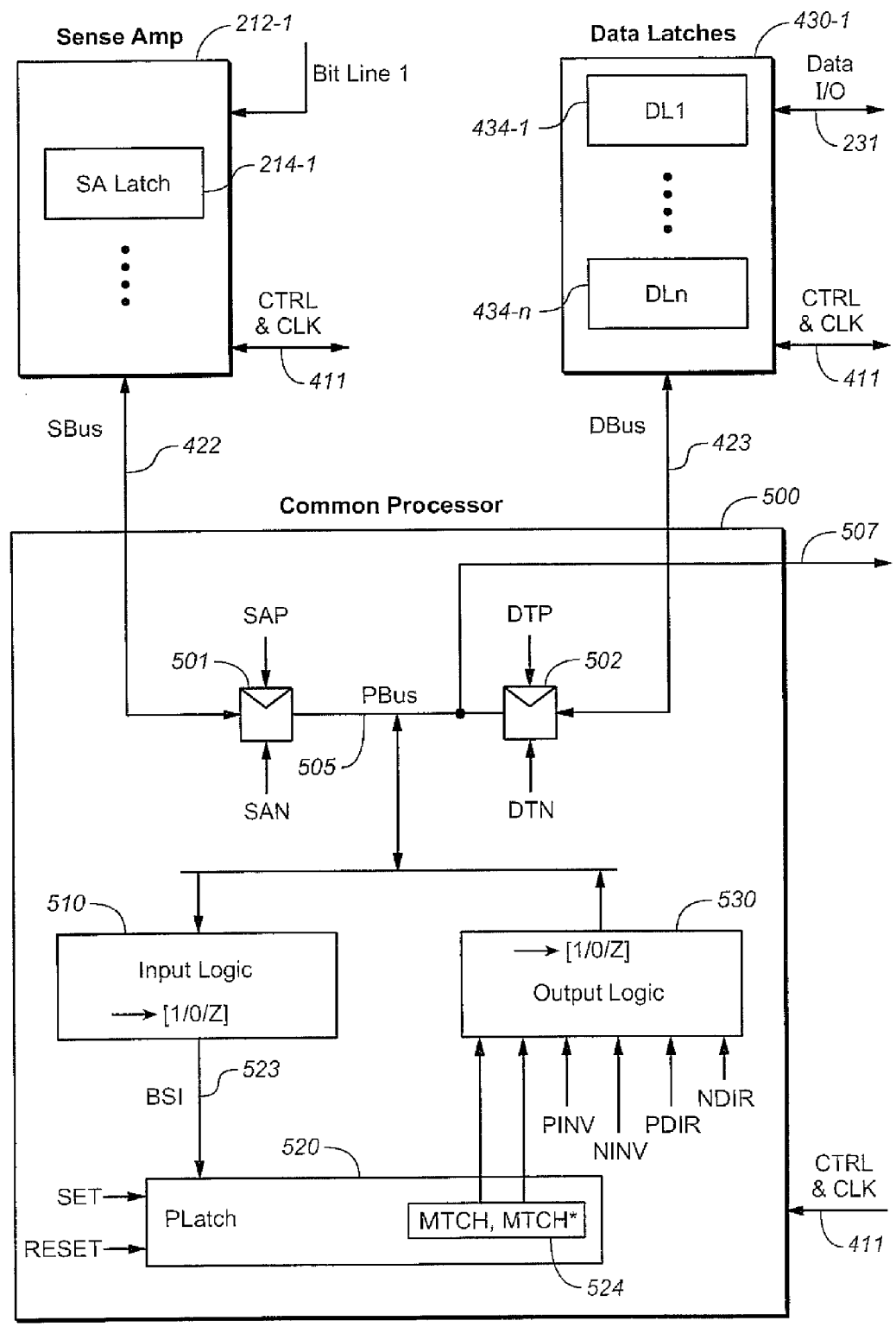
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
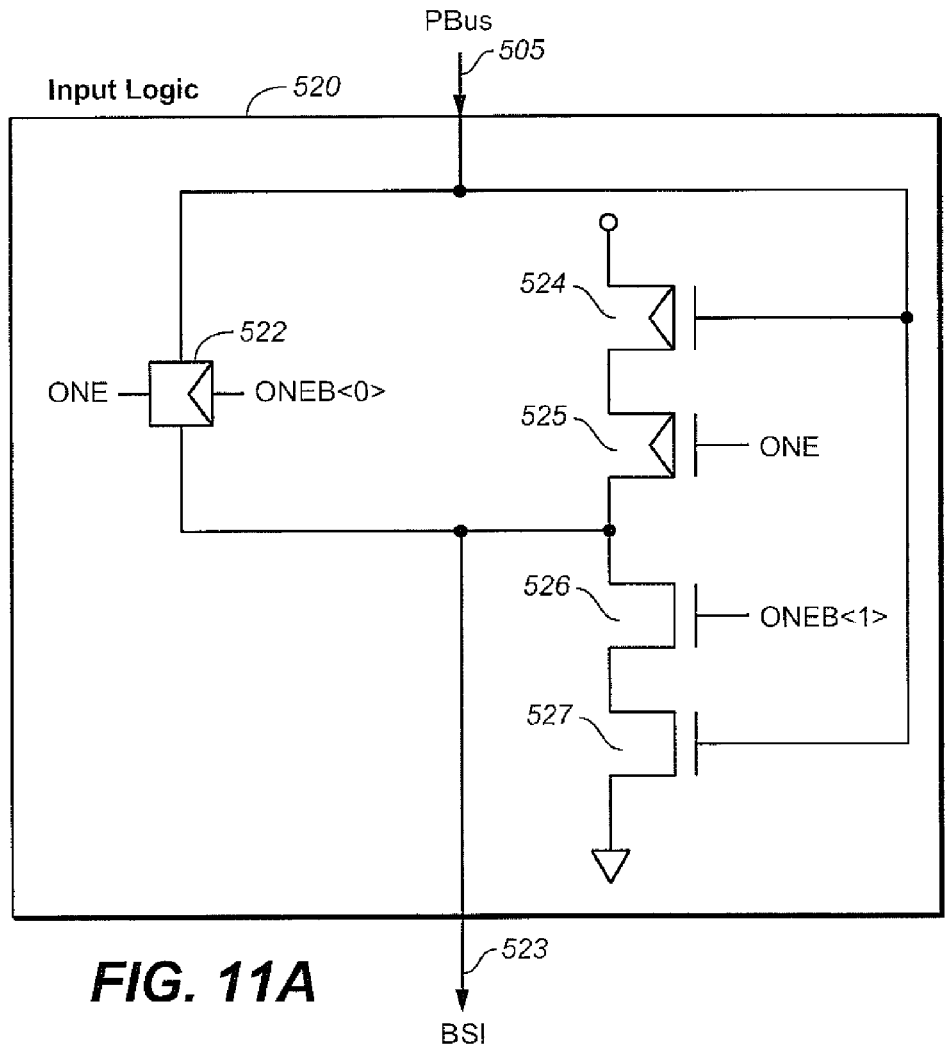
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
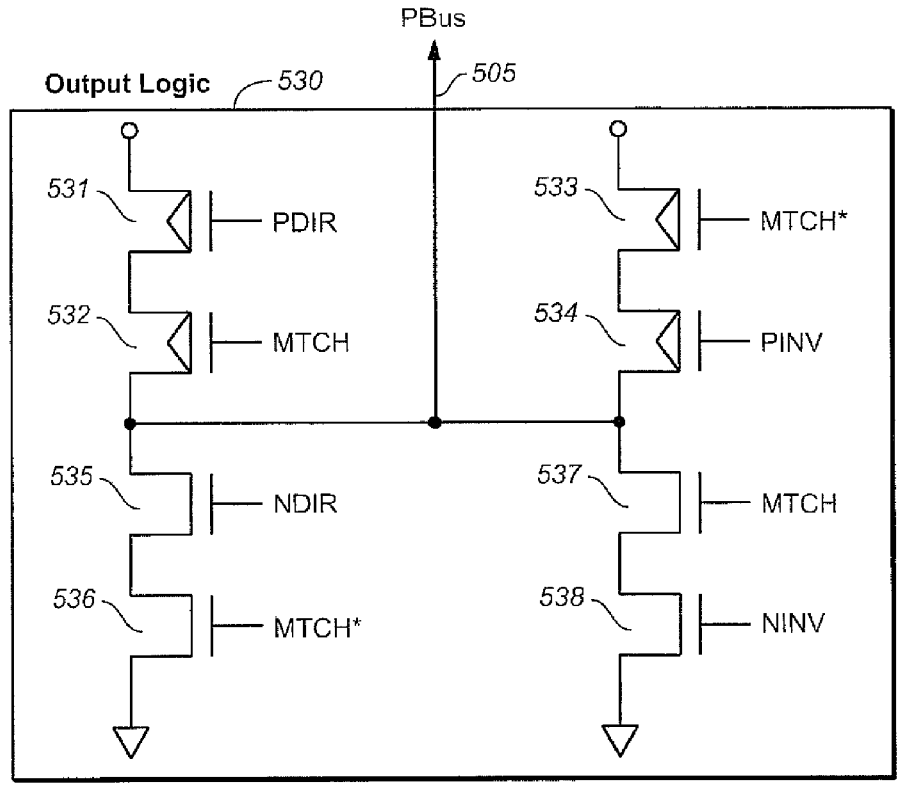
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRE-CHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application Ser. No. 11/026,536, Dec. 29, 2004, which is hereby incorporated in its entirety by this reference.

Use of Data Latches in Cache Operations

A number of aspects of the present invention make use of the data latches of the read/write stacks described above in FIG. 10 for cache operations that will data in and out while the internal memory is doing other operations such as read, write, or erase. In the above-described architectures, data latches are shared by a number of physical pages. For example, as on the read/write stacks of the bit lines, shared by all of the word lines, so while one operation is going on, if any of these latches are free, they can cache data for future operations in the same or another word line, saving transfer time as this can be hidden behind another operation. This can improve performance by increasing the amount of pipelining of different operations or phases of operations. In one example, in a cache program operation, while programming one page of data another page of data can be loaded in, saving on transfer time. For another example, in one exemplary embodiment, a read operation on one word line is inserted into a write operation on another word line, allowing the data from the read to be transferred out of the memory while the data write continues on.

Note that this allows data from another page in the same block, but on a different word line, to be toggled out (to, for example, do an ECC operation) while the write or other operation is going on for the first page of data. This interphase pipelining of operations allows the time needed for the data transfer to be hidden behind the operation on the first page of data. More generally, this allows a portion of one operation to be inserted between phases of another, typically longer, operation. Another example would be to insert a sensing operation between phases of, say, an erase operation, such as before an erase pulse or before a soft programming phase used as the later part of the erase.

To make the relative times needed for some of the operations discussed, a set of exemplary time values for the system described above can be take as:

Data write: ~700 µs (lower page ~600 µs, upper page 800 µs)
  Binary data write: ~200 µs
  Erase: ~2,500 µs
  Read: ~20-40 µs
  Read and toggle out data: 2 KB data, ~80 µs; 4 KB ~160 µs; 8 KB ~320 µs These values can be used for reference to give an idea of the relative times involved for the timing diagrams below. If have a long operation with different phases, a primary aspect will interpose in a quicker operation using the shared latches of the read/write stacks if latches available. For example, a read can be inserted into a program or erase operation, or a binary program can be inserted into an erase. The primary exemplary embodiments will toggle data in and/or out for one page during a program operation for another page that shares the same read write stacks, where, for example, a read of the data to be toggled out and modified is inserted into the verify phase of the data write.

The availability of open data latches can arise in a number of ways. Generally, for a memory storing n bits per cell, n such data latches will be needed for each bit line; however, not all of these latches are needed at all times. For example, in a two-bit per cell memory storing data in an upper page/lower page format, two data latches will be needed while programming the lower page. More generally, for memories storing multiple pages, all of the latches will be needed only when programming the highest page. This leaves the other latches available for cache operations. Further, even while writing the highest page, as the various states are removed from the verify phase of the write operation, latches will free up. Specifically, once only the highest state remains to be verified, only a single latch is needed for verification purposes and the others may be used for cache operations.

The following discussion will be based on a four state memory storing two-bits per cell and having two latches for data on each bit line and one additional latch for quick pass write, as described in U.S. Pat. No. 7,158,421. The operations of writing the lower page, or erasing, or doing a post erase soft program are basically a binary operation and have one of the data latches free, which can use it to cache data. Similarly, where doing an upper page or full sequence write, once all but the highest level has verified, only a single state needs to verify and the memory can free up a latch that can be used to cache data. An example of how this can be used is that when programming one page, such as in a copy operation, a read of another page that shares the same set of data latches, such as another word line on the same set of bit lines, can be slipped in during the verify phase of the write. The address can then be switched to the page being written, allowing the write process to pick up where it left off without having to restart. While the write continues, the data cached during the interpolated read can be toggled out, checked or modified and transferred back to be present for writing back in once the earlier write operation completes. This sort cache operation allows the toggling out and modification of the second page of data to be hidden behind the programming of the first page.

Figure 13:
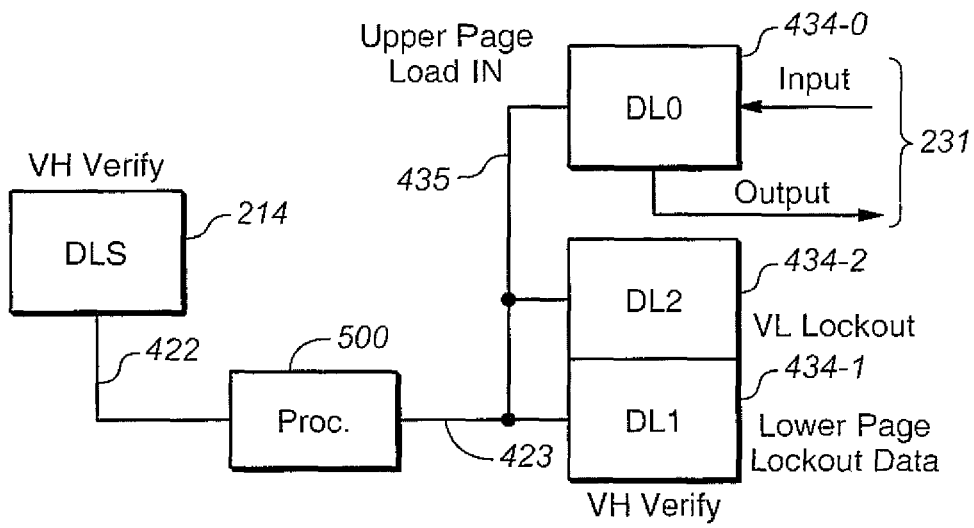
Figure 14:
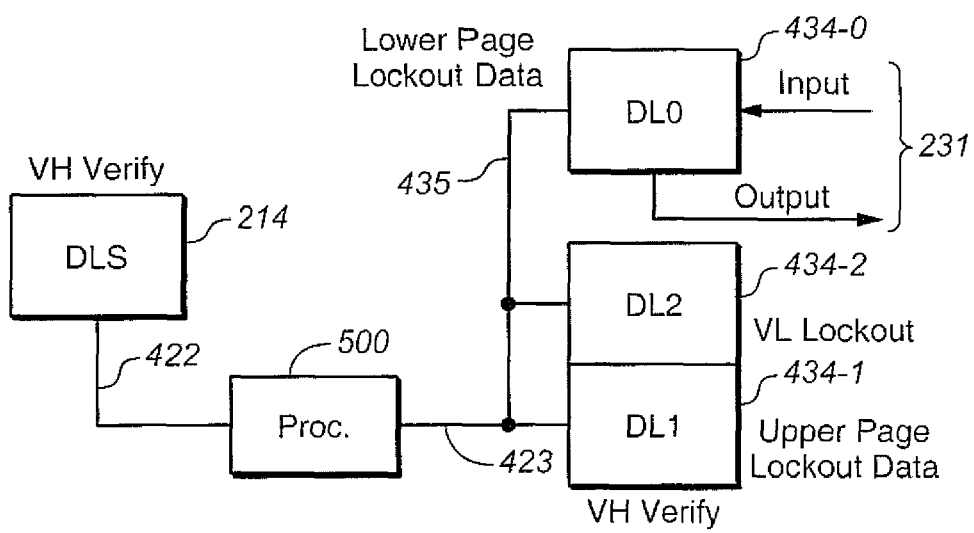

As a first example, a cache program operation for a two-bit memory operating in single page (lower page/upper page format) program mode. FIG. 13 is a simplified version of FIG. 10 that shows some specific elements that are relevant to the present discussion in a two-bit embodiment, the other elements being suppressed to simplify the discussion. These include data latch DL0 434-0, which is connected Data I/O line 231, data latch DL1 434-1, connected to common processor 500 by line 423, data latch DL2 434-2, commonly connected with the other data latches by line 435, and sense amp data latch DLS 214, which is connected to common processor 500 by line 422, The various elements of FIG. 13 are labeled according to their disposition during the programming of the lower page. The latch DL2 434-2 is used for the lower verify (VL) in quick pass write mode, as is described in U.S. Pat. No. 7,158,421; the inclusion of the register, and of using quick pass write when it is included, are optional, but the exemplary embodiment will include this register.

The programming of the lower page can include the following steps:

(1) The process begins by resetting data latches DL0 434-0 the default value "1". This convention is used to simplify partial page programming as cells in a selected row that are not to be programmed will be program inhibited.

(2) Program data is supplied to DL0 434-0 along I/O line 231.

(3) The program data will be transferred to DL1 434-1 and DL2 434-2 (if this latch is included and quick pass write is implemented).

(4) Once the program data is transferred to DL 1 434-1, data latch DL0 434-0 can be reset to "1" and, during program time, the next data page can be loaded to DL0 434-0 along I/O line 231, allowing the caching of a second page while a first page is being written.

(5) Once the first page is loaded into DL1 434-1, programming can begin. DL1 434-1 data is used for lockout of the cell from further programming. DL2 434-2 data is used for the lower verify lockout that governs the transition to the second phase of quick pass write, as described in U.S. Pat. No. 7,158,421.

(6) Once programming begins, after a programming pulse, the result of the lower verify is used to update DL2 434-2; the result of the higher verify is used to update DL1 434-1. (This discussion is based on the "conventional" coding, where the lower page programming is to the A state. This, and other codings are discussed further in U.S. Pat. Nos. 7,158,421 and 7,251,160. The extension of the present discussion to other codings follows readily.)

(1) In determining of whether programming is complete, only the DL1 434-1 registers of the cells of row (or appropriate physical unit of program) are checked.

Note that under this arrangement, in step 6, the latch DL0 434-0 is no longer required and can be used to cache data for the next programming operation. Additionally, in embodiments using quick pass write, once the second, slowly programming phase is entered, the latch DL2 434-2 could also be made available for caching data, although, in practice, it is often the case that this is only available in this way for a fairly short time period that does not justify the additional overhead that is often required to implement this feature.

Figure 15:
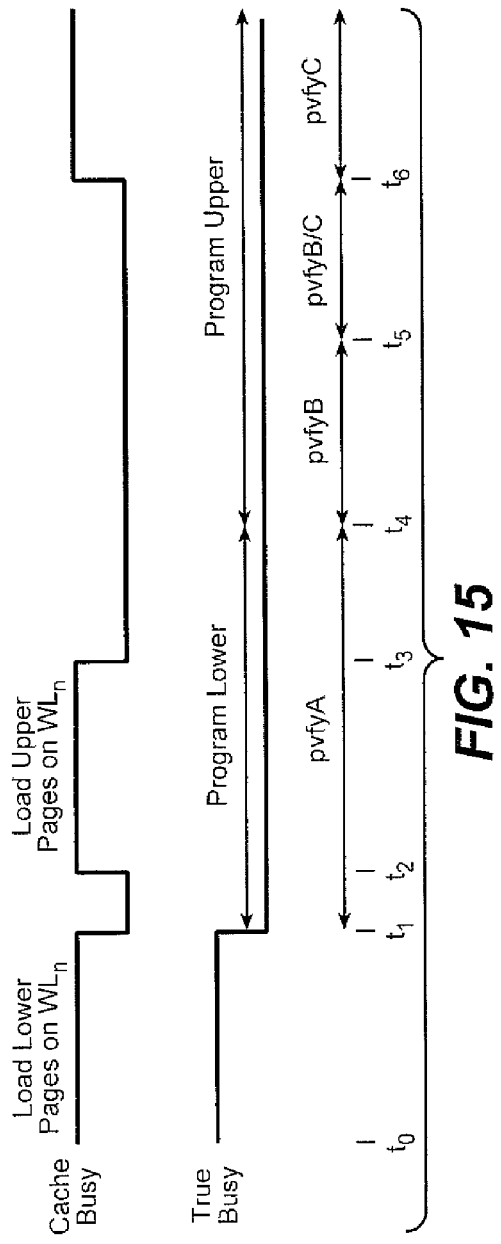
FIG. 15 illustrates aspects of cache program in the single page mode.

FIG. 15 can be used to illustrate many of the aspects of cache program in the single page mode that has been described in the last few paragraphs. FIG. 15 shows the relative timing of what events are occurring internally to the memory (the lower "True Busy" line) and as seen from external to the memory (the upper "Cache Busy" line).

At time $t_0$ the lower page to be programmed onto the selected word line (WLn) is loaded into the memory. This assumes the first lower page of data has not been previously cached, as it will be for the subsequent pages. At time $t_1$ the lower page is finished loading and the memory begins to write it. Since this is equivalent to a binary operation at this point, only the state A needs to be verified ("pvfyA") and the data latch DL0 434-0 is available to receive the next page of data, here taken as the upper pages to be programmed into WLn, at time $t_2$, which is consequently cached in latch DL0 434-0 during the programming of the lower page. The upper page finishes loading at time $t_3$ and can be programmed as soon as the lower page finishes at $t_4$. Under this arrangement, although all of the data (lower and upper page) to be written into physical unit of programming (here, word line WLn), the memory must wait from time $t_3$ to time $t_4$ before the upper page data can be written, unlike the full sequence embodiment described below.

The programming of the upper page begins at time $t_4$, where initially only the B state is verified ("pvfyB"), the C state being added at $t_5$ ("pvfyB/C"). Once the B state is no longer being verified at $t_6$, only the C state needs to be verified ("pvfyC") and the latch DL0 434-0 is freed up. This allows the next data set to be cached while the upper page finishes programming.

As noted, according to the single page algorithm with cache program, as shown in FIG. 15, even though the upper page data may be available at time $t_3$, the memory will wait until time $t_4$ before starting to write this data. In a conversion to a full sequence program operation, such as is developed more fully in U.S. patent application Ser. No. 11/013,125, once the upper page is available the upper and lower page data can be programmed concurrently.

The algorithm for cache program in full sequence (low to full conversion) write begins with lower page program as above. Consequently, steps (1)-(4) are as for the lower page process in single page program mode:

(1) The process begins by resetting data latches DL0 434-0 the default value "1". This convention is used to simplify partial page programming as cells in a selected row that are not to be programmed will be program inhibited.

(2) Program data is supplied to DL0 434-0 along I/O line 231.

(3) The program data will be transferred to DL1 434-1 and DL2 434-2 (if this latch is included and quick pass write is implemented).

(4) Once the program data is transferred to DL 1 434-1, data latch DL0 434-0 can be reset to "1" and, during program time, the next data page can be loaded to DL0 434-0 along I/O line 231, allowing the caching of a second page while a first page is being written.

Once the second page of data is loaded, if correspond to the upper of the lower page being written and the lower page is not yet finished programming, the conversion to full sequence write can be implemented. This discussion focuses on the use of the data latches in such an algorithm, with many of the other details being developed more full in co-pending, commonly assigned U.S. patent application Ser. No. 11/013,125.

(5) After the upper page data is loaded into latch DL0 434-0, a judgment will be done in the address block to check if the 2 pages are on the same word line and the same block, with one page is the lower page and one is upper page. If so, then the program state machine will trigger a lower page program to full sequence program conversion if this is allowed. After any pending verify is complete, the transition is then effected.

(6) Some operation parameters will be typically be changed when the program sequence changed from lower page to full sequence. In the exemplary embodiment these page include:

(i) Maximum program loop for the number of pulse verify cycles will be changed from that of the lower page algorithm to that of the full sequence if the lower page data has not been locked out, but the number of program loops completed will not be reset by the conversion.

Figure 16:
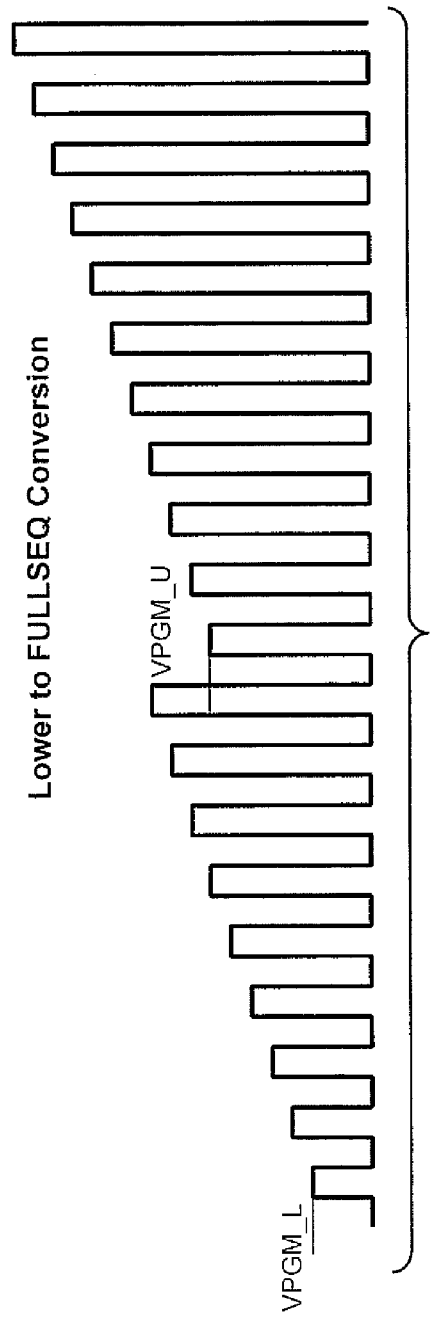
FIG. 16 shows a programming waveform that can be used in a lower page to full sequence conversion.

(ii) As shown in FIG. 16, the programming waveform starts with the value VPGM_L used in the lower page programming process. If the programming waveform has progressed to where it exceeds the beginning value VPGM_U used in the upper page process, at conversion to full sequence, the staircase will drop back down to VPGM_U prior to continuing up the staircase.

(iii) The parameters determining the step size and maximum value of the program pulse are not changed.

(7) A full sequence read of the current state of the memory cells should be performed to guarantee the right data will be programmed for multi-level coding. This ensures that states that may have formerly locked out in the lower page programming, but which require further programming to take account of their upper page data, are not program inhibited when the full sequence begins.

(8) If quick pass write is activated, the data of latch DL2 434-2 will be updated as well to reflect the upper page program data, since this was formerly based on the lower verify for only the A state.

(9) The programming then resumes with the multi-level, full sequence program algorithm. If the program waveform in the lower page process has increased beyond the upper page starting level, the waveform is stepped back to this level at conversion time, as shown in FIG. 16.

Figure 17:
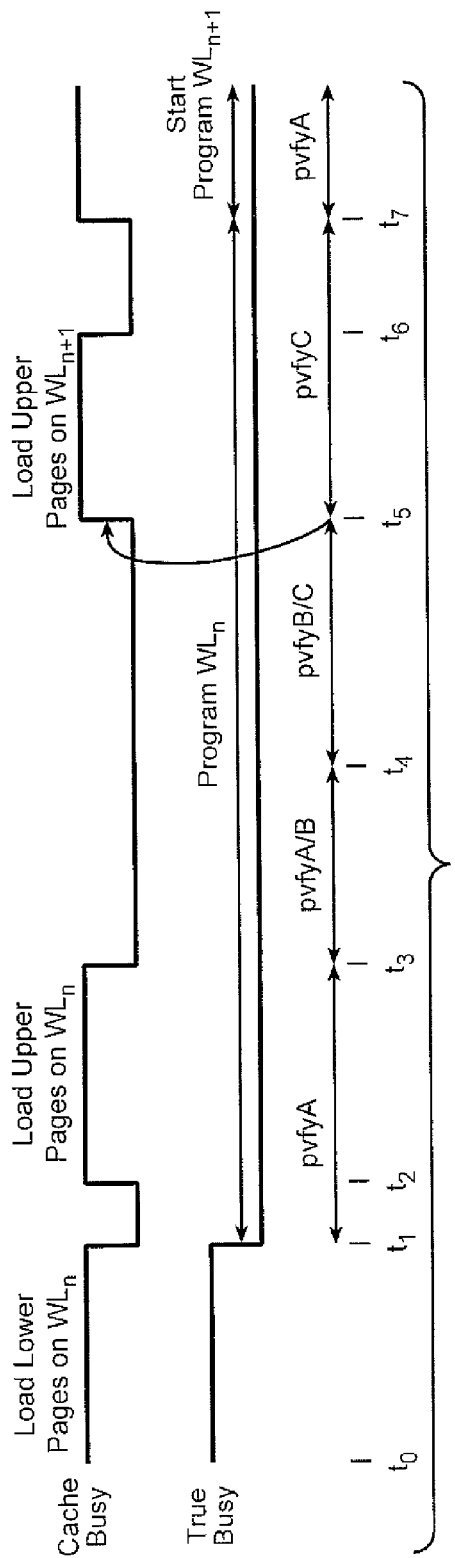
FIG. 17 illustrates the relative timing in a cache program operation with a full sequence conversion.

FIG. 17 is a schematic representation of the relative times involved in the lower page to full sequence conversion write process. Up until time $t_3$, the process is as described above for the process in FIG. 15. At $t_3$ the upper page of data has been loaded and the transition is made to the full sequence algorithm the verification process is switched to include the B states with the A states. Once all of the A states lock out, the verify process switches to checking for the B and C states at time $t_4$. Once the B states have verified at $t_5$, only the C state needs to be checked and a register can be freed up to load the next data to be programmed, such as the lower page on the next word line ($WL_{n+1}$) as indicated on the Cache Busy line. At time $t_6$ this next data set has been cached and one the programming of the C data for the previous set concludes at $t_7$, this next data set begins programming. Additionally, while the (here) lower page on word line $WL_{n+1}$ is programming, the next data (such as the corresponding upper page data) can be loaded into the open latch DL0 434-0.

During the full sequence write, a status report is implemented in a way that gives lower page and upper page status independently. At the end of the program sequence, if there are unfinished bits, a scan of physical page can be performed. A first scan can check latch DL0 434-0 for unfinished upper page data, a second scan can check DL1 434-1 for unfinished lower page data. Since, the verification of the B state will change both DL0 434-0 and DL1 434-1 data, an A state verification should be performed in the way that DL1 434-1 data "0" will be changed to "1" if the bit's threshold value is higher than the A verify level. This post verify will check on whether any under programmed B levels are passing at the A level; if they are passing at the A level, then the error is only on upper page and not on lower page; if they are not passing at the A level, then both lower and upper pages have error.

If the cache program algorithm is used, after the A and B data are programmed, the C state will be transferred to latch DL1 434-1 to finish programming. In this case, the scan of latch is not necessary for lower page, because the lower page will have already passed program without any failed bits.

Another set of exemplary embodiments of the present invention relate to page copy operations, where a data set is relocated from one location to another. Various aspects of data relocation operations are described in U.S. patent applications number U.S. Ser. No. 10/846,289, filed May 13, 2004; Ser. No. 11/022,462, Dec. 21, 2004; and number U.S. Ser. No. 10/915,039, filed Aug. 9, 2004; and U.S. Pat. No. 6,266,273, which are all hereby incorporated by reference, which are all hereby incorporated by reference. When data is copied from one location to another, the data is often toggled out to be checked (for error, for example), updated (such as updating a header), or both (such correcting detected error). Such transfers are also to consolidate date in garbage collection operations. A principal aspect of the present invention allows for a data read to an open register to be interpolated during the verify phase of a write operation, with this cached data then being transferred out of the memory device as the write operation continues, allowing the time for toggling the data out to hide behind the write operation.

Figure 18:
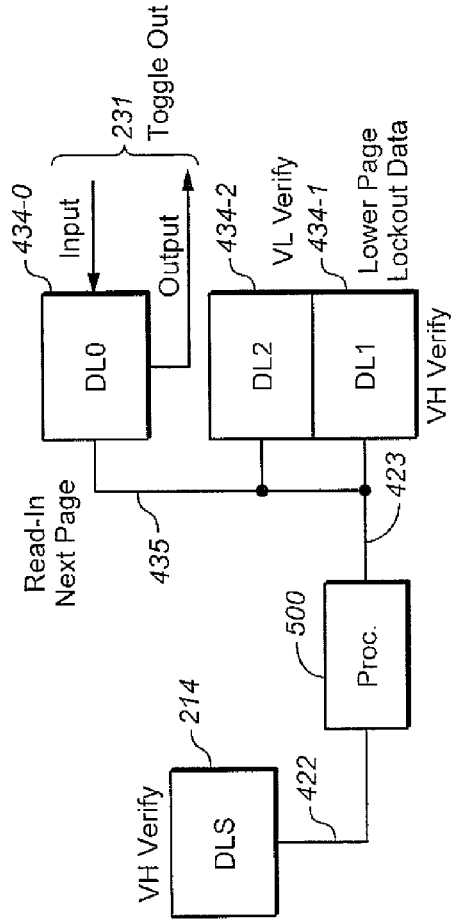
FIG. 18 describes the disposition of latches in a cache page copy operation.

The following presents two exemplary embodiments of a cache page copy operation. In both cases, an implementation that uses a quick pass write implementation is described. FIG. 18 indicates the disposition of the exemplary arrangement of latches as the process progresses.

The first version of cache page copy will write to a lower page and can include the following steps, where read addresses are labeled M, M+1, . . . , and write addresses are labeled N, N+1, . . . :

(1) The page to be copied ("page M") is read into latch DL1 434-1. This can be either an upper or lower page of data (2) Page M is then transferred into DL0 434-0.

(3) The data in DL0 434-0 is then toggle out and modified, after which it is transferred back into the latch.

(4) The program sequence can then begin. After data to be written into the lower page N is transferred to DL1 434-1 and DL2 434-2, the latch DL0 434-0 is ready for cache data. This lower page will be programmed. For this embodiment, the program state machine will stop here.

(5) The next page to be copied is then read into DL0 434-0. Programming can then resume. The state machine, stopped at the end of step (4), will restart the program sequence from the beginning.

(6) Programming continues until the lower page finishes. The copy destination page address will determine whether a write is to a lower or an upper page. If the program address is an upper page address, then the programming sequence will not be stopped until the programming finishes and the read of step (5) will be executed after the write is complete.

In a second cache page copy method, the program/verify process can be paused to insert a read operation and then restart the write operation, picking up at the point where it left off. The data that was read during this interleaved sensing operation can then be toggled out while the resumed write operation continues on. Also, this second process allows for the page copy mechanism to be used in an upper page or full sequence write process once only the C state is being verified and one latch on each bit line opens up. The second cache page copy operation begins with the same first three steps as in the first case, but then differs. It can include the following steps:

(1) The page to be copied ("page M") is read into latch DL1 434-1. This can be either a lower or upper page (2) The data from page M is then transferred into DL0 434-0. (As before, N, etc. will denote a write address, M, etc., for a read address.)

(3) The data in DL0 434-0 is then toggled out, modified, and then transferred back to the latch.

(4) The state machine program will go to an infinite wait state until the command a read command is entered and then a read of another page, say the next page M+1, to latch DL0 434-0 will begin.

(5) Once the read of step (4) is complete, the address is switched back to word line and block address to program the data in steps (1-3) into page N (here, a lower page) and the programming is resumed.

(6) After the read of page M+1 is finished, the data can be toggled out, modified, and returned. Once the process is complete, the write can be converted to a full sequence operation if the two pages are the corresponding upper and lower pages on the same WL.

(7) Once the A and B levels are done in the full sequence write, the data in DL0 434-0 will be transferred to DL1 434-1, as in the normal cache program described earlier, and a read command for another page (e.g., page M+2) can be issued. If there is not a single page to full sequence conversion, the lower page will finish the writing and then the upper page will start. After the B level state is done completely, the same DL0 434-0 to DL1 434-1 data transfer will occur, and the state machine will go into state of waiting for the read command for page M+2.

(8) Once the read command arrives, the address is switched to the read address and the next page (page M+2) is read out.

(9) Once the read is complete, the address will be switched back to previous upper page address (program address N+1) until the write finishes.

As noted above, the exemplary embodiments include the latch DL2 434-2 used for the lower verify of the quick pass write technique in addition to the latches DL0 434-0 and DL1 434-1 used in holding the (here, 2 bits) of data that can be programmed into each of the memory cells. Once the lower verify is passed, the latch DL2 434-2 may also be freed up and used to cache data, although this is not done in the exemplary embodiments.

Figure 19A:
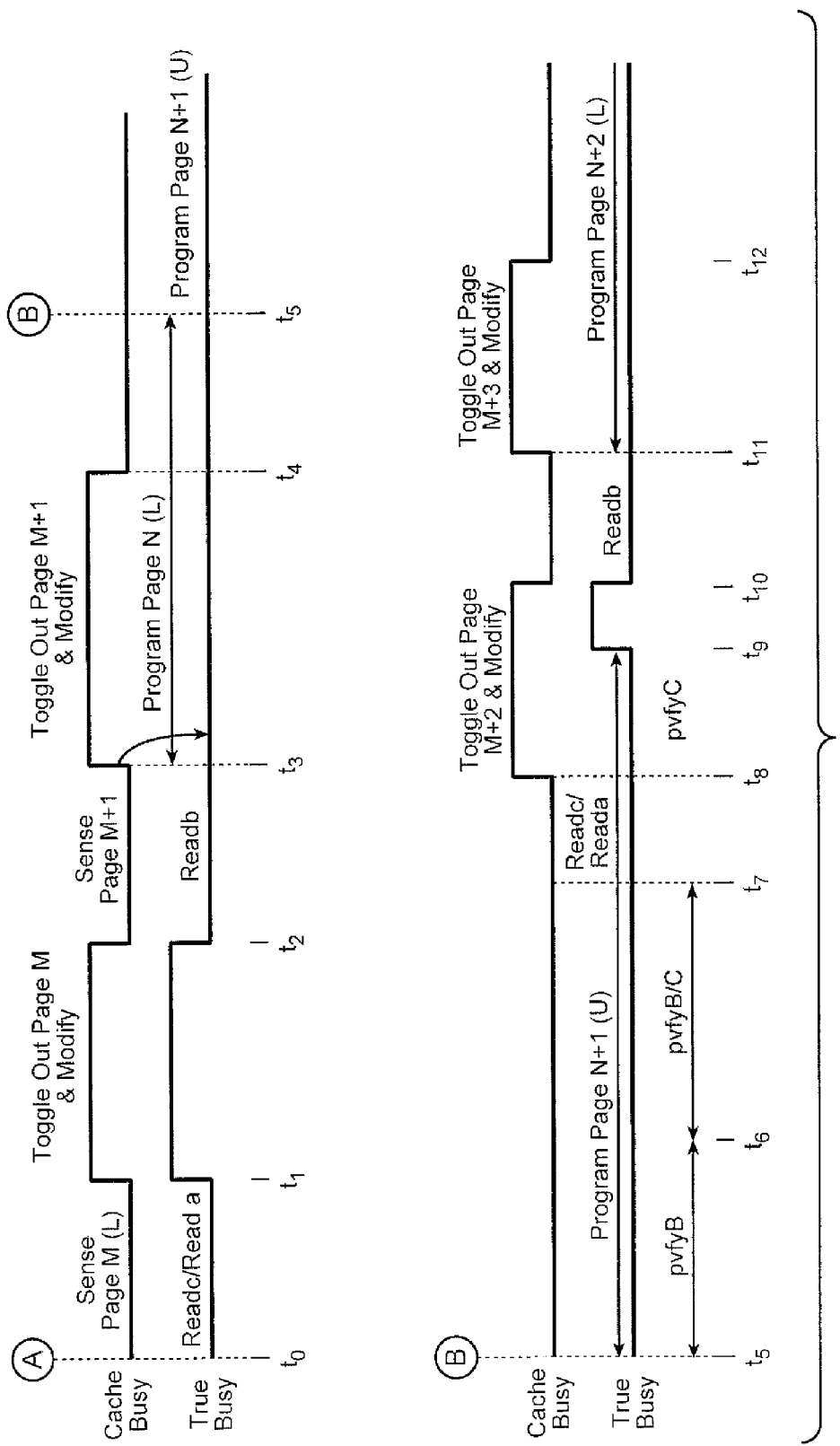
FIGS. 19A and 19B illustrate the relative timings in cache page copy operations.
Figure 19B:
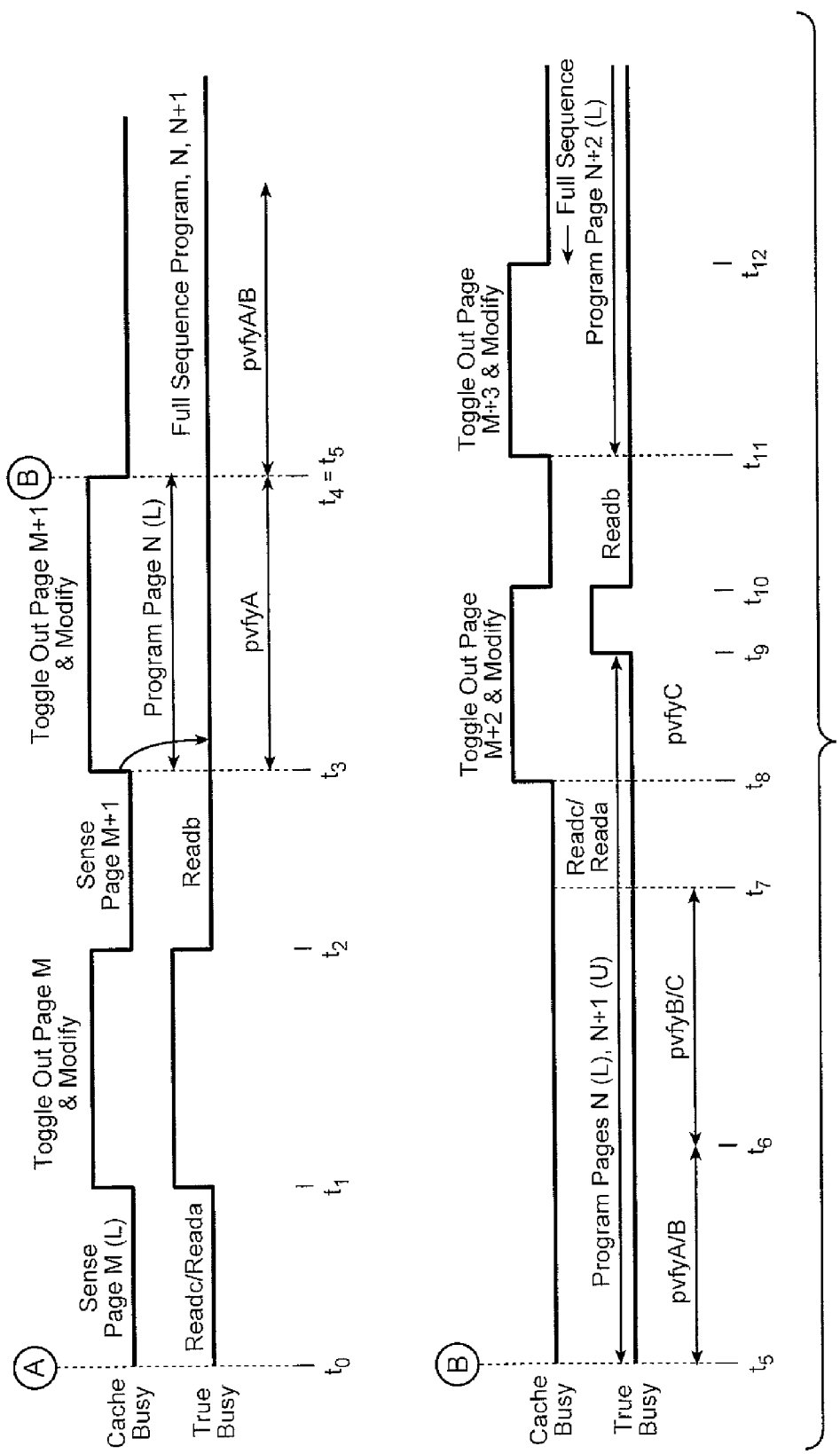

FIGS. 19A and 19B illustrate the relative timing of the second cache page copy method, where FIG. 19B illustrates the algorithm with the full sequence write conversion and FIG. 19A illustrates the algorithm without. (Both FIGS. 19A and 19B are composed of two parts, the first, upper part beginning at the broken vertical line A, corresponding $t_0$, and ending with the broken vertical line B, corresponding to $t_5$; the second, lower part is a continuation of the upper portion and begins with the broken vertical line B, corresponding to $t_5$. In both cases the line B at time $t_5$ is same in the upper portion as in the lower portion, being just a seam in two parts allowing it to be displayed on two lines.)

FIG. 19A shows a process that starts with reading of a first page (page M) that is taken to be a lower page in this example, assumes no data has previously been cached, and operates in single page mode, waiting until the lower page has finished writing before beginning to write the upper page. The process starts at time $t_0$ with a read of the page M (Sense page M (L)), which here is a lower that is sensed by a read at the A and C levels in this coding. At time at time $t_1$ the read is complete and page M can be toggled out and checked or modified. Beginning at time $t_2$ a next page (here page M+1, the upper page corresponding to the same physical as lower page M) is sensed by reading at the B level, a process that finishes at time $t_3$. At this point, the first page (originating from Page M) (lower) is ready to be programmed back into the memory at page N and the data read from page M+1 is being held in a latch and can be transferred out to be modified/checked. Both of these processes can start at the same time, here $t_3$. Using the typical time values described above, the data from page M+1 has been toggled out and modified by time $t_4$; however, for the embodiment not implementing a full sequence conversion, the memory will wait until page N finishes at time $t_5$ to begin writing the second read page of data (originating from Page M+1) into page N+1.

As page N+1 is an upper page, its write begins initially with a verification at the B level, the C level being added at $t_6$. Once the storage elements having a target state B all lock out (or the maximum count is reached) at time $t_7$, the B state verification is dropped. As described above, according to several principal aspects of the present invention, this allows a data latch to be freed up, an ongoing write operation is suspended, a reading operation (at a different address than the suspended program/verify operation) is interposed, the write then resumes where it left off, and the data sensed the interposed write operation can be toggled out while the resumed write operation runs on.

At time $t_7$ the interposed write operation is performed for the, here, lower page M+2. This sensing is finished at time $t_8$ and the write of page N+1 picks back up and the data from page M+2 is concurrently toggled out and modified. In this example, page N+1 finishes programming at time $t_9$ before page M+2 is finished at time $t_{10}$. At time $t_{10}$ a write of the data originating from page M+2 could begin; however, in this embodiment, instead a read of page M+3 is first executed, allowing for this page's data to be toggled out and the modification to be hidden behind the writing of the data originating from page M+2 into page N+2, beginning at time $t_{11}$. The process then continues on as in the earlier parts of the diagram, but with the page numbers shifted, with time $t_{11}$ corresponding to time $t_3$, time $t_{12}$ corresponding to time $t_4$, and so on until the copy process is stopped.

FIG. 19B again shows a process that starts with reading of a lower page, page M that is taken to be a lower page, and assumes no data has previously been cached. FIG. 19B differs from FIG. 19A by implementing a conversion to full sequence write at time $t_4$. This roughly speeds up the process by the time $(t_5-t_4)$ of FIG. 19A. At time $t_4$ (=$t_5$ in FIG. 19A), the various changes related to the full sequence conversion are implemented as described previously. Otherwise, the process is similar to that of FIG. 19A, including those aspects of the present invention found between times $t_7$ and $t_{12}$.

In both the page copy processes and the other techniques described here that involve writing data, which states are verified at a given time can be selected intelligently, along the lines describe in U.S. patent application Ser. No. 10/314,055, filed Dec. 5, 2002, which is hereby incorporated by reference. For example, in the full sequence write, the write process can begin verifying only the A level. After ever A verify, it is checked to see whether any bits have passed. If so, the B level can be added to the verify phase. The A level verify will be removed after all storage units with it as their target values verify (or except a maximum count based on a settable parameter). Similarly, after the verifications at the B level, a verify of the C level can be added, with the B level verify being removed after all storage units with it as their target values verify (or except a maximum count based on a settable parameter).

Although the various aspects of the present invention have been described with respect to certain embodiments, it is understood that the invention is entitled to protection within the full scope of the appended claims.

What is claimed is:

1. A method of operating a non-volatile memory device which includes an array of memory cells and a set of read/write circuits for operating on a group of memory cells of said array in parallel, each read/write circuits having a set of data latches for latching input and/or output data of a corresponding one of said group of memory cells, the method comprising:
   loading a first data set into a first plurality of the data latches;
   performing a first operation on a first group of memory cells using all of the latches of the first plurality of the sets of data latches;
   during said first operation, releasing some, but less than all, of the latches of the first plurality of the sets of data latches; and
   during said first operation, caching a second data set for a second operation in the released ones of said first plurality of the sets of data latches.

2. The method of claim 1, wherein said second data set is supplied from external to the memory device.

3. The method of claim 1, wherein the first operation includes multiple phases and said second data set is read from a second group of memory cells distinct from the first group of memory cells, the second data set being read between phases of the first operation.

4. The method of claim 3, wherein the first operation is a write operation having alternating program and verify phases and the first set of data is the data to be written into the first group of memory cells.

5. The method of claim 4, wherein the cached data set is subsequently transferred out of said first plurality of the sets of data latches during the write operation.

6. The method of claim 4, wherein the alternating program and verify phases resume where write process was paused while the second data set was read.

7. The method of claim 4, wherein said memory cells are multi-level memory cells storing N bits of data, where N is greater than one, and wherein each of said sets of data latches includes N data latches and said first data set is N bit data.

8. The method of claim 3, wherein the first and second data sets correspond to distinct first and second word lines of the memory.

9. The method of claim 1, wherein each of said sets of latches is associated with a distinct bit line of the memory.

10. A method of operating a non-volatile memory device which includes an array of memory cells and a set of read/write circuits for operating on a group of memory cells of said array in parallel, each read/write circuits having a set of data latches for latching input and/or output data of a corresponding one of said group of memory cells, the method comprising:

storing a first set of data for a first group of the memory cells into the corresponding sets of data latches;

writing the first set of data into said first group of memory cells using all of the corresponding sets of data latches, wherein the writing includes alternating program and verify phases;

during the writing of the first set of data, releasing some, but less than all, of the corresponding sets of data latches pausing said writing between one of the program phases and one of the verify phases;

subsequent to said pausing, reading a second set of data from a second group of the memory cells into the released latches of said corresponding sets of data latches; and subsequent to said reading, resuming the paused writing.

11. The method of claim 10, wherein the writing is managed by a state machine, said pausing is in response to receiving a command for said reading, and the resuming is in response to completing the reading.

12. The method of claim 10, further comprising:

subsequent to said reading, transferred the second set of data out of the memory during the resumed writing.

* * * * *